US012322581B1

(12) United States Patent
Chhavi et al.

(10) Patent No.: US 12,322,581 B1
(45) Date of Patent: Jun. 3, 2025

(54) THREE-DIMENSIONAL SWEEP PROBE SYSTEM

(71) Applicant: Georgia Tech Research Corporation, Atlanta, GA (US)

(72) Inventors: Chhavi Chhavi, Atlanta, GA (US); Mitchell L. R. Walker, Atlanta, GA (US)

(73) Assignee: GEORGIA TECH RESEARCH CORPORATION, Atlanta, GA (US)

( * ) Notice: Subject to any disclaimer, the term of this patent is extended or adjusted under 35 U.S.C. 154(b) by 0 days.

(21) Appl. No.: 18/967,224

(22) Filed: Dec. 3, 2024

(51) Int. Cl.
*H01J 37/32* (2006.01)
*B64G 1/40* (2006.01)

(52) U.S. Cl.
CPC ........ *H01J 37/32926* (2013.01); *B64G 1/413* (2023.08); *H01J 2237/24507* (2013.01)

(58) Field of Classification Search
CPC ...... H01J 37/32926; H01J 2237/24507; B64G 1/413
USPC .............................. 324/500, 600, 76.11, 464
See application file for complete search history.

(56) References Cited

U.S. PATENT DOCUMENTS

| 11,834,204 B1* | 12/2023 | Gorokhovsky ....... F03H 1/0043 |
| 2017/0278683 A1* | 9/2017 | Hey ............................ B64F 5/60 |
| 2024/0237185 A1* | 7/2024 | Zheng ..................... H05H 1/28 |

OTHER PUBLICATIONS

Dushman, S., "Scientific Foundations of Vacuum Technique," New York, John Wiley and Sons, Inc., 1949, by General Electric Company.
Jahn, R. G., "Physics of Electric Propulsion," Dover Publ., Mineola, NY, 2006, Physics of Electric Propulsion @ 1968 by McGraw-Hill, Inc.
Goebel , D. M. et al., "Fundamentals of Electric Propulsion: Ion and Hall Thrusters," Jet Propulsion Laboratory, California Institute of Technology, Wiley, Mar. 2008, https://doi.org/10.1002/9780470436448.
Hofer, R. et al., A., "High-Specific Impulse Hall Thrusters, Part 2: Efficiency Analysis," Journal of Propulsion and Power—J Propul Power, vol. 22, Jul.-Aug. 2006, pp. 732-740. https://doi.org/10.2514/1.15954.

(Continued)

*Primary Examiner* — Raul J Rios Russo
*Assistant Examiner* — Trung Q Nguyen
(74) *Attorney, Agent, or Firm* — Blank Rome LLP

(57) ABSTRACT

A system is described comprising a first controller configured to control a radial arm. The system further comprises a second controller configured to control a probe apparatus motor. The radial arm is configured to move a probe apparatus in a horizontal direction across a horizontal cross-section of a plasma plume generated by a thruster, in response to receiving a first control signal from the first controller. The probe apparatus motor is configured to move a probe, coupled to the probe apparatus, in a vertical direction across a vertical cross-section of the plasm plume, in response to receiving a second control signal from the second controller. And the probe is configured to detect an ion beam current density corresponding to the thruster, based at least in part on a movement of the probe apparatus in the horizontal direction and a movement of the probe in the vertical direction.

26 Claims, 15 Drawing Sheets

(56) References Cited

OTHER PUBLICATIONS

O'Reilly, D. et al., "Electric Propulsion Methods for Small Satellites: A Review," Aerospace, vol. 8, No. 1, 2021, p. 22. https://doi.org/ 10.3390/aerospace8010022, https://www.mdpi.com/journal/aerospace.

Lev, D., et al. "The Technological and Commercial Expansion of Electric Propulsion," Acta Astronautica, vol. 159, (2019), pp. 213-227, https://doi.org/10.1016/j.actaastro.2019.03.058,www.elsevier.com/locate/actaastro.

Bapat, A. et al., "Hall-Effect Thrusters for Deep-Space Missions: A Review," IEEE Transactions on Plasma Science, vol. 50, No. 2, 2022, pp. 189-202, https://doi.org/10.1109/TPS.2022.3143032.

Raitses, Y. et al., "Orbit Transfer with a Variable Thrust Hall Thruster Under Drag," Journal of Spacecraft and Rockets, vol. 36, No. 6, Nov.-Dec. 1999, pp. 875-881. https:l/doi.org/10.2514/2.3506.

Misuri T. et al., "HT5k Hall Thruster to Improve Small Launcher Capabilities," IEPC-2013-279, presented at the 33rd International Electric Propulsion Conference, Oct. 6-10, 2013.

Jackson J. et al., "Development of High Power Hall Thruster Systems to Enable the NASA Exploration Vision," presented at the 2018 Space Propulsion Conference, Seville, 2018.

Victor, A. L. et al., "Ion-Energy Plume Diagnostics on the BHT-600 Hall Thruster Cluster," Journal of Propulsion and Power, vol. 22, No. 6, 2006, pp. 1421-1424, https://doi.org/10.2514/1.20514.

Beal, B. E. et al., "Plasma Properties in the Plume of a Hall Thruster Cluster," Journal of Propulsion and Power, vol. 20, No. 6, 2004, pp. 985-991. https://doi.org/10.2514/1.3765.

Hall S. J. et al., "Performance and High-Speed Characterization of a 100-KW Nested Hall Thruster," Journal of Propulsion and Power, vol. 38, No. 1, 2022, pp. 40-50. https://doi.org/10.2514/I. B38080.

Liang R., "The Combination of Two Concentric Discharge Channels into a Nested Hall-Effect Thruster., "Ph. D. dissertation, University of Michigan, 2013.

Duchemin, O. et al., "Thrust Vector Control Using Multi-Channel Hall-Effect Thrusters," presented at the 43rd AIAA/ASME/SAE/ASEE Joint Propulsion Conference & Exhibit, Jul. 8-11, 2007, Cincinnati, OH, AIAA 2007-5203, https://doi.org/10.2514/6.2007-5203, @ 2007 by Snecma. Published by the American Institute of Aeronautics and Astronautics, Inc., with permission.

Benavides, G. F et al., "Diagnostic for Verifying the Thrust Vector Requirement of the AEPS Hall-Effect Thruster and Comparison to the NEXT-C Thrust Vector Diagnostic," presented at the 2018 Joint Propulsion Conference, Cincinnati, Ohio, 2018. https://doi.org/10.2514/6.2018-4514.

Sohl, G. et al, "Thrust Vectoring of Ion Engines.," Journal of Spacecraft and Rockets, vol. 6, No. 2, 1969, pp. 143-147, Pasadena, California, https://doi.org/10.2514/3.29552.

Homa, J. et al., "Ion Beamlet Vectoring by Grid Translation," AIAA/JSASS/DGLR 16th International Electric Propulsion Conference, Nov. 17-19, New Orleans, Louisiana, American Institute of Aeronautics and Astronautics, https://doi.org/10.2514 /6.1982-1895.

Van Reijen, B. et al. High Precision Thrust Vector Determination through Full Hemispherical RPA Measurements Assisted by Angular Mapping of Ion Energy Charge State Distribution, IEPC-2013-284. The 33rd International Electric Propulsion Conference, The George Washington University, USA, Oct. 6-10, 2013.

Pollard, J. et al., "Thrust Vector Measurements with the T5 Ion Engine," 31st Joint Propulsion Conference and Exhibit, American Institute of Aeronautics and Astronautics, Los Angeles, California, © 1995, AIAA-95-2829, https://doi.org/10.2514/6.1995-2829.

Polk, J. et al., "Behavior of the Thrust Vector in the NSTAR Ion Thruster," 34th AIAAIASMEISAEIASEE Joint Propulsion Conference and Exhibit, American h1stitute of Aeronautics and Astronautics. https://doi.org/10.2514/6.1998-3940.

Haag, Thomas, "Translation Optics for 30 Cm Ion Engine Thrust Vector Control," IEPC-01-116, 2002, Glenn Research Center, Cleveland, Ohio, Jun. 2002, http://gltrs.grc.nasa.gov/GLTRS.

Gulczinski, III, Frank Stanley, "Examination of the Structure and Evolution of Ion Energy Properties of a 5 KW Class Laboratory Hall effect Thruster at Various Operational Conditions," University of Michigan, (1999).

Brown, D. L. , et al., "Recommended Practice for Use of Faraday Probes in Electric Propulsion Testing," Journal of Propulsion and Power, vol. 33, No. 3, May-Jun. 2017, pp. 582-613. https://doi.org/10.2514/1.B35696.

Kieckhafer, A W., "Recirculating Liquid Nitrogen System for Operation of Cryogenic Pumps," IEPC-2011-217, presented at the 32nd International Electric Propulsion Conference, Electric Rocket Propulsion Society, Wiesbaden, Germany, Sep. 11-15, 2011.

Haas, J. M. et al., "Internal Plasma Potential Profiles in a Laboratory-Model Hall Thruster," Physics of Plasmas, vol. 8, No. 2, Feb. 2001, American Institute of Physics, pp. 652-660. https://doi.org/10.1063/1.1338535.

Peterson, P.Y. et al., "Experimental Investigation of Hall Thruster Internal Magnetic Field Topography," 37th AIAA/ASME/SAE/ASEE Joint Propulsion Conference and Exhibit, Jul. 8-11, 2001, Salt Lake City, Utah, Published by the American Institute of Aeronautics and Astronautics with permission, © 2001 by Peter Person, https://doi.org/ 10.2514/6.2001- 3890.

Frieman, J. D., Brown et al., "Electrical Facility Effects on Faraday Probe Measurements," Journal of Propulsion and Power, vol. 34, No. 1, Jan.-Feb. 2018, pp. 267-269, https://doi.org/10.2514/1.B36467.

Brown, D. L. et al., "Evaluation of Facility Effects on Ion Migration in a Hall Thruster Plume," Journal of Propulsion and Power, vol. 27, No. 3, May-Jun. 2011, https://doi.org/10.2514/1.54143.

Xu, K G., "Ion Collimation and In-Channel Potential Shaping Using in-Channel Electrodes for Hall Effect Thrusters," Dissertation, 2012, Georgia Institute of Technology, Retrieved Mar. 31, 2024, http://hdl.handle.net/1853/44830.

* cited by examiner

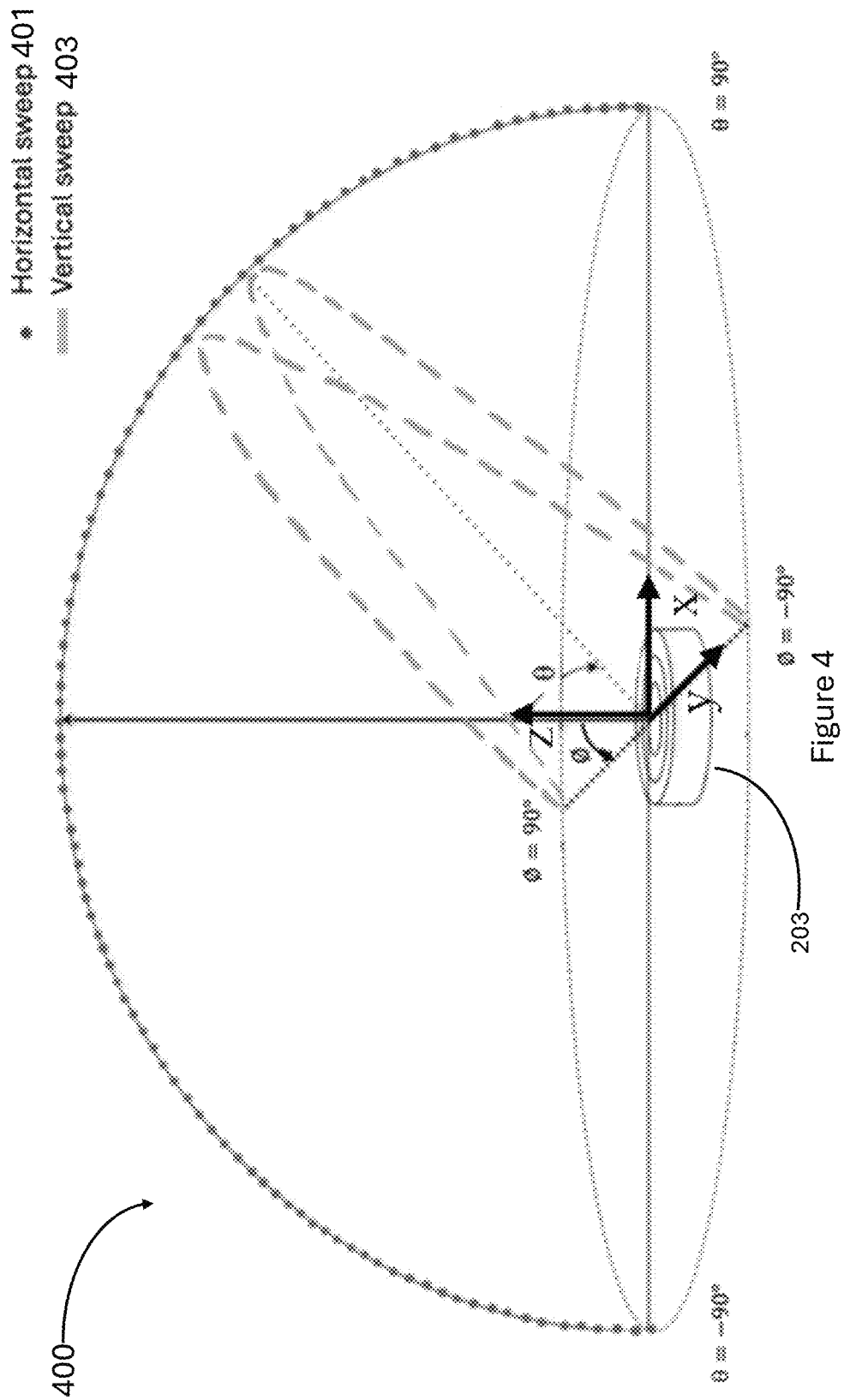

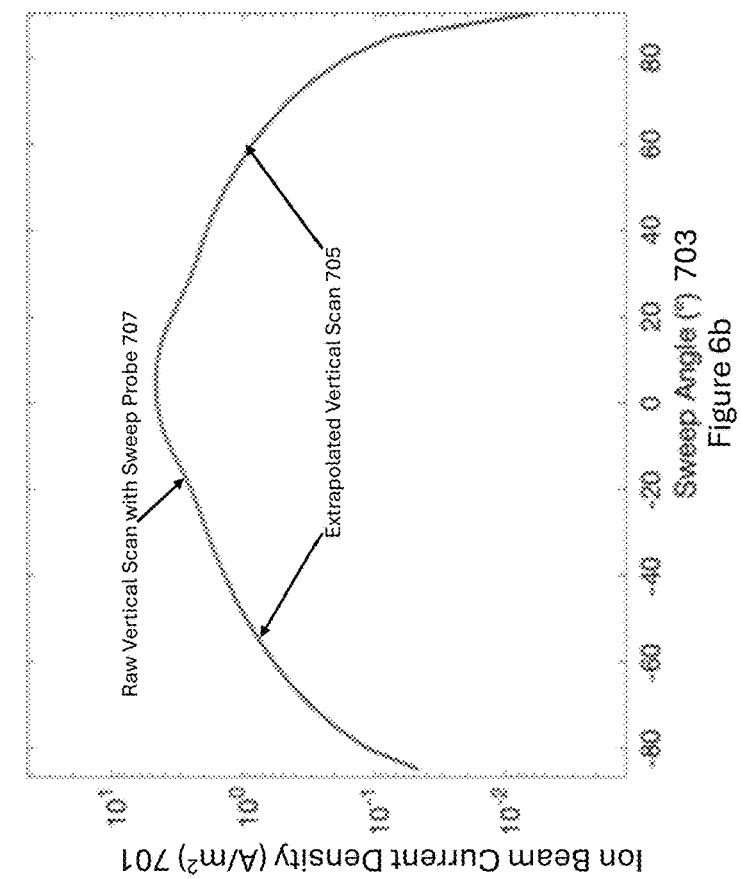
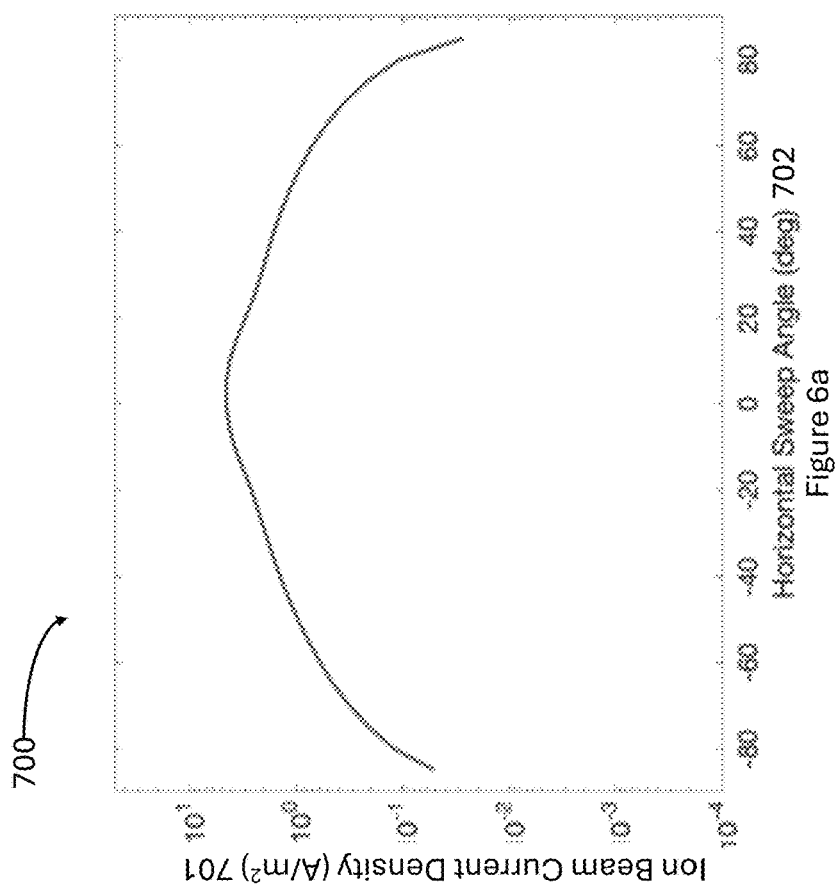
Figure 6b
Figure 6a

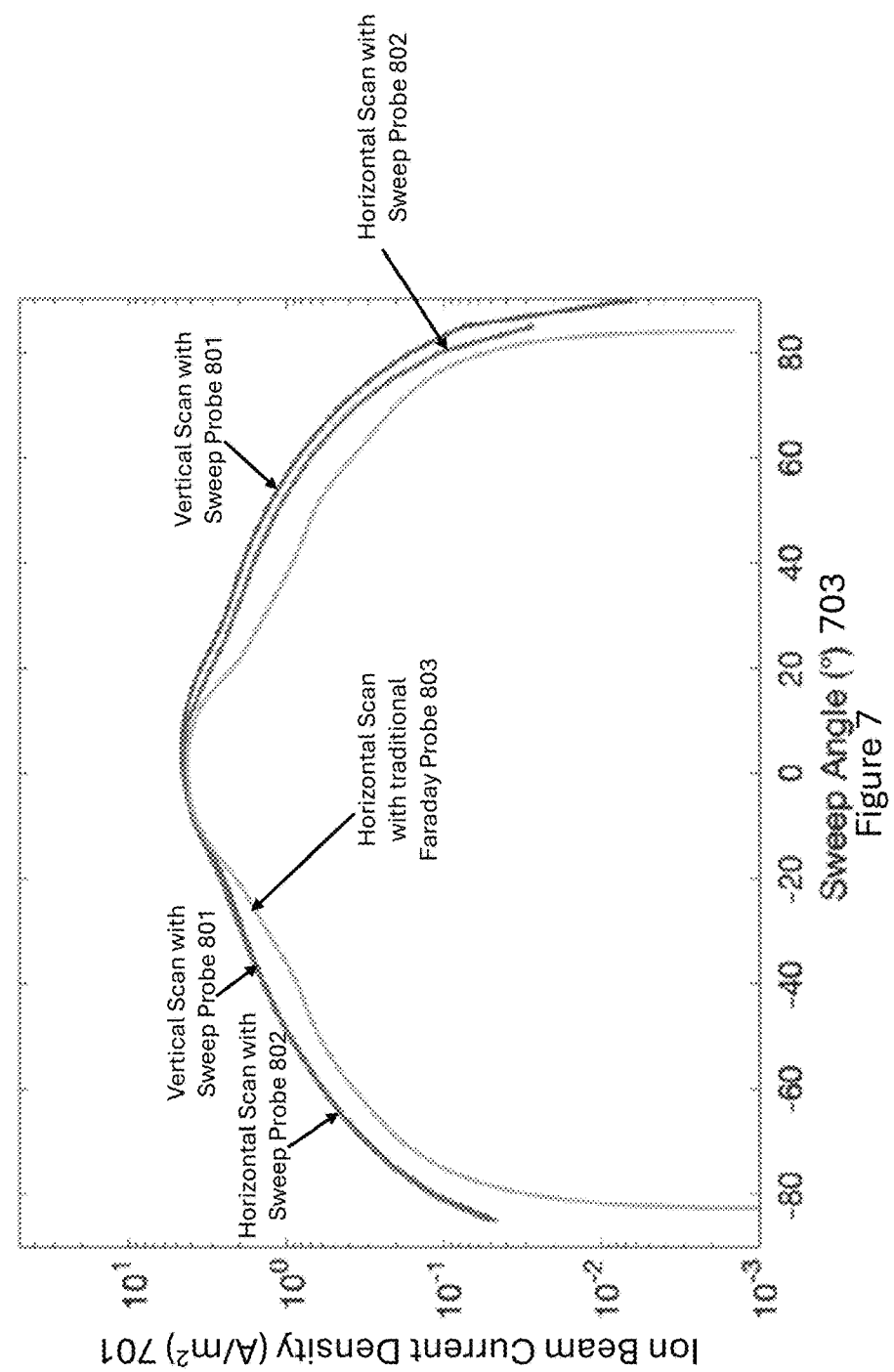

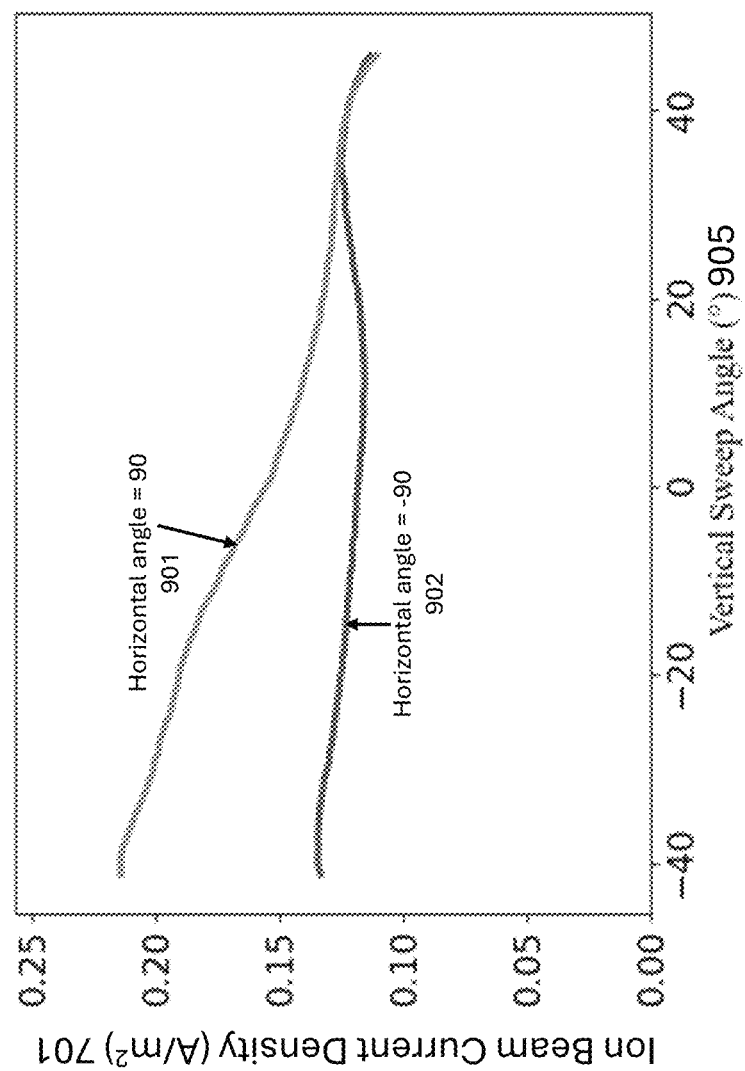

THREE-DIMENSIONAL SWEEP PROBE SYSTEM

FIELD OF THE INVENTION

The present disclosure generally relates to a ion current probe apparatus for measuring ion beam current densities associated with a plasma plume generated by thrusters used to maneuver a spacecraft.

BACKGROUND

Present-day space missions necessitate propulsion devices with significant power and thrust capabilities. The mass production of propulsion devices such as hall effect thrusters (HETs) increases the likelihood that manufacturing defects will manifest in components of the HET. As a result of this mass production, some HETs are unlikely to pass acceptance tests. The presence of manufacturing defects across various HET components can lead to disparities in plasma properties, which can modify the thruster's performance parameters. For instance, thrust, efficiency, and stability are performance parameters controlled by ions produced when plasma is formed, and these parameters are of particular importance because the plasma emitted from a HET is responsible for propelling the spacecraft in very specific directions that give rise to complex maneuvers. In addition to modifying the plasma parameters and the associated processes, these inconsistencies can cause a variation in the beam current and its subsequent deviance from a centerline of the HET, leading to an off-axis thrust vector.

A HET are electrostatic devices that accelerate propellant by ionizing the particles and using an axial electric field and radial magnetic field. The acceleration of the ionized propellant particles from the HET generates the thrust needed to maneuver a spacecraft. An increasing number of satellite operators utilize HETs because of their high specific impulse and high efficiency. The rising popularity of HETs in commercial sectors contributes to their utilization in propulsion systems for Low Earth Orbit (LEO), Geosynchronous Earth Orbit (GEO), and interorbital missions. Because of their high demand, HETs are being mass-produced, for use in satellites orbiting the earth in complex constellations. Although it is relatively easy to produce HETs in large quantities, it is crucial to conduct acceptance testing to ensure that HETs meet the necessary performance and capability requirements for spaceflight operations prior to integration on the spacecraft.

Numerous studies have been conducted addressing ion beam current density non-uniformities present in HETs. Non-uniformities arise in HETs due to several manufacturing features, such as non-uniform propellant flow, propellant neutral density non-uniformities, anode orifice configurations and electrical shorts. The non-uniformities present in the HET result in azimuthal variations of plasma properties inside the channel. One state-of-the-art approach to determining the non-uniformities in the ion beam current density, is to use a computational method to characterize azimuthal non-uniformities in the magnetic field in order to evaluate the effect of the azimuthal magnetic field gradient effect.

Non-axisymmetric magnetic fields in HETs is also a concern. To address the conditions and consequences of a non-axisymmetric magnetic field in HETs, one of the potential consequences of asymmetric magnetic fields that was taken into consideration was thrust vectoring. In order to evaluate the deviation of a thrust vector, in some state-of-the-art approaches, an azimuthal magnetic field asymmetry of a SPT-100 thruster was simulated by creating eight additional coils and four additional outer poles at 300 V and 4.5 mg/s of xenon anode flow conditions. Allowing the electron temperature, plasma potential, and neutral number density to be constant and symmetric for inertial wall calculations resulted in a simplified model. The consideration of ion volume recombination was omitted to enhance the model's ease of compilation. Using simulation techniques to analyze the distribution of ion flux density and velocity, visual evidence was obtained supporting the concept of thrust vectoring.

Several investigations have been carried out to examine and study the thrust vectoring capabilities of the HETs during operation. Various thrust vector measurement systems have been developed utilizing the Faraday probe, double Langmuir, cylinder rods, and retarding potential analyzer (RPA). Thrust vector characterization was conducted by Pollard using four double-wired Langmuir probes aligned in the form of a cross situated 200 cm downstream of the thruster exit plane. A monitoring system utilizing reflective mirrors and charged couple device (CCD) cameras was employed to determine the thruster's centerline. The movement of the ion beam centroid was traced using a motorized position monitoring mechanism to detect any divergence in the thrust vector. The motorized position monitoring mechanism was employed to maintain null error signals by equilibrating the current gathered in two mutually perpendicular axes of a thrust vector measurement device, thereby enabling the tracking of an ion beam current centroid. Nonetheless, the failure to detect the azimuthal ion beam current unsymmetric condition, and the unexplained systematic mistake leading to an overall thrust loss inspired the development of this disclosure.

Another state-of-the-art approach to measuring an ion beam current, is to use a thrust vector probe comprising 16 vertical and 16 horizontal graphite rods, each with a diameter of 9 mm and a length of 1.2 m. A probe grid was positioned at the far end of a vacuum chamber, enabling uninterrupted beam exposure for long-term testing. A Leica Mancat theodolyte system employing optical technology used to precisely measure the alignment between the thrust vector probe and a thruster axis of the thrust vector probe. An exhaustive analysis of the thrust vectoring condition for the Engineering Model Thruster (EMT2), which served as an engineering prototype of the NSTAR thruster, was conducted through 8,000 hours of testing. The current obtained by the horizontal graphite rods varied during the experiment. One possible cause of an initial thrust vector offsets, such as unsymmetric magnetic fields, have been identified, but have not been thoroughly investigated. Nevertheless, this methodology proved effective in gathering rod current data corresponding to ion beam current throughout an extended period of testing using an ion beamlet model.

In yet another state of the art approach, a thrust vectoring device using a retarding potential analyzer (RPA) and energy-selective mass spectroscopy can be used to analyze ion beam current and thrust vectoring. The thrust vectoring device is a scanner comprised of 37 RPAs mounted in a semicircle configuration on a pole. The semicircular configuration on the pole, is sometimes referred to as a boom, and was designed to provide data 1 m downstream of the thruster exit plane, allowing for the measurement of far-field plume characteristics. The RPAs enabled the utility of ion selection at a particular energy level, thereby permitting collections of ions of varying energy levels. Although the use of RPA enabled greater accuracy, it can require a prolonged exposure to a plasma plume, leading to the heightened deterioration of RPA grids. The RPA boom construction provided the ability to map segments of plasma plume.

In yet another approach state of the art approach, a thrust vectoring device comprising an array of Faraday sensors can map a portion of an ion beam current. The thrust vectoring device consists of 23 Faraday probes affixed on a 1-m curved aluminum framework installed on a motorized radial arm. The thrust vectoring device collects data ranging from −22° to 22° in a vertical direction, encompassing approximately 44° of a plasma plume. The thruster vectoring device successfully generated a comprehensive three-dimensional map of the ion beam at various operating conditions for the Advanced Electric Propulsion System (AEPS) HET. The apparatus enabled precise measurements of the beam current and thrust vector while preventing any escalation in the back sputter effect on the thruster. However, this approach requires several Faraday probes which increases the costs associated with measuring the ion beam current density of a HET.

The instant disclosure overcomes the shortcoming of the existing state of the art approaches disclosed herein with a cost-effective solution that is modular and easily replicable.

BRIEF DESCRIPTION OF THE DRAWINGS

In order that the present disclosure may be readily understood, aspects of the vial adapter are illustrated by way of examples in the accompanying drawings, in which like parts are referred to with like reference numerals throughout.

FIG. 4 is a schematic of Faraday probe sweep path traveled by the sweep probe apparatus according to various aspects of the disclosure.

FIG. 6a is a graph of ion beam current densities calculated as a function of a horizontal sweep angle for an, extrapolated vertical scan, using a Faraday probe and a sweep probe apparatus according to various aspects of the disclosure.

FIG. 6b is a graph of ion beam current densities calculated as a function of a horizontal sweep angle for an, extrapolated vertical scan and vertical scan with a sweep probe, using a Faraday probe and a sweep probe apparatus according to various aspects of the disclosure.

FIG. 7 is a graph of ion beam current densities calculated as a function of a sweep angle for a horizontal scan with a sweep probe, vertical scan with the sweep probe, and a horizontal scan with a traditional Faraday probe according to various aspects of the disclosure.

FIG. 8 is a graph of the ion beam current density calculated as a function of a vertical sweep angle at the ends of a given horizontal sweep region according to various aspects of the disclosure.

DETAILED DESCRIPTION

Figure 1:
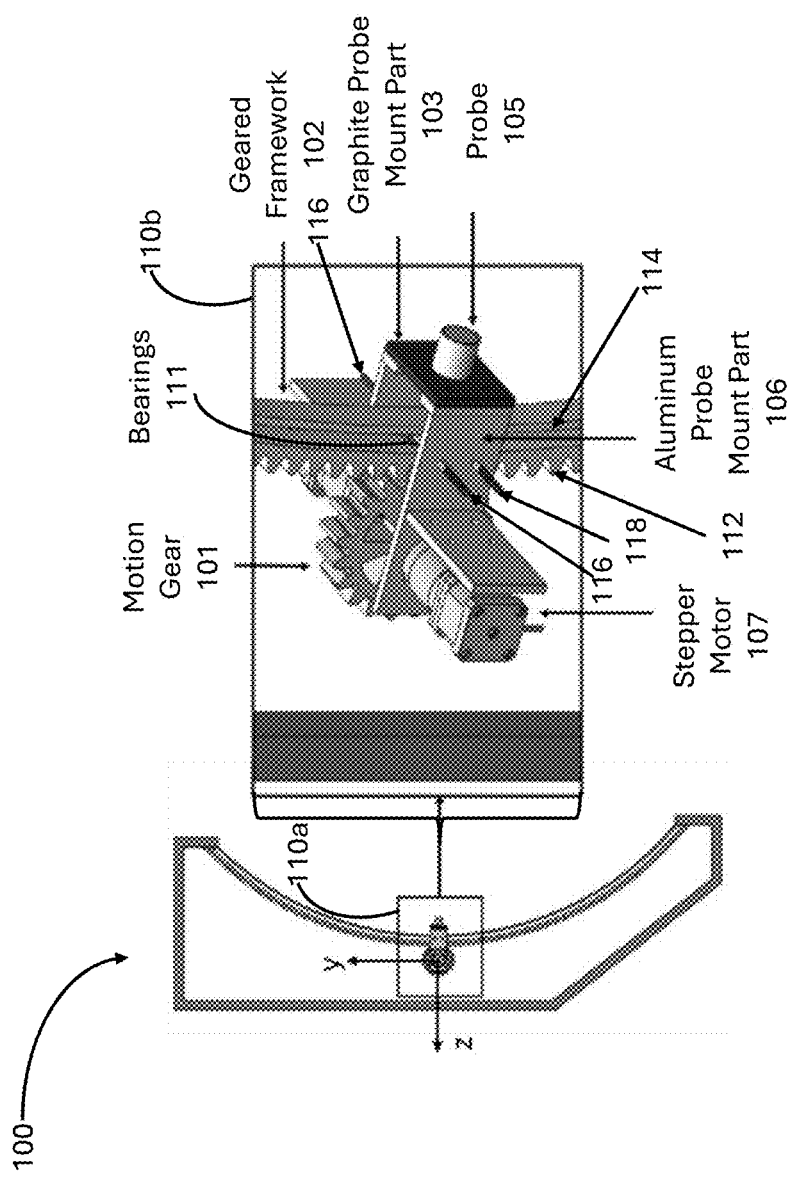
FIG. 1 is an illustration of a sweep probe apparatus according to various aspects of the disclosure.

The following description of the embodiments is merely exemplary in nature and is in no way intended to limit the subject matter of the present disclosure, their application, or uses.

It is noted that, as used in this specification and the appended claims, the singular forms "a," "an," and "the," include plural references unless expressly and unequivocally limited to one referent. As used herein, the term "include" and its grammatical variants are intended to be non-limiting, such that recitation of items in a list is not to the exclusion of other like items that can be substituted or added to the listed items. For example, as used in this specification and the following claims, the terms "comprise" (as well as forms, derivatives, or variations thereof, such as "comprising" and "comprises"), "include" (as well as forms, derivatives, or variations thereof, such as "including" and "includes") and "has" (as well as forms, derivatives, or variations thereof, such as "having" and "have") are inclusive (i.e., open-ended) and do not exclude additional elements or steps. Accordingly, these terms are intended to not only cover the recited element(s) or step(s), but may also include other elements or steps not expressly recited. Furthermore, as used herein, the use of the terms "a" or "an" when used in conjunction with an element may mean "one," but it is also consistent with the meaning of "one or more," "at least one," and "one or more than one." Therefore, an element preceded by "a" or "an" does not, without more constraints, preclude the existence of additional identical elements.

The instant disclosure is drawn to a design and implementation of a hemispherical sweep probe apparatus that overcomes the limitations of complex electronic setups with multiple probes and to achieve a broader ion beam coverage. The sweep probe apparatus provides the characteristics of a three-dimensional plasma beam. The sweep probe apparatus also provides a comprehensive measurement setup to detect plasma non-uniformities and potential use in studying thrust vectoring when the thruster is operated in uniform and non-uniform magnetic field configurations. The sweep probe apparatus sweeps a probe (e.g., a Faraday probe) vertically across the plasma plume of the thruster (e.g., HET) while spanning radially using a radial arm to gather three-dimensional ion currents of the thruster at different operating conditions. The innovative diagnostic apparatus offers a quantitative measurement method for assessing the influence of magnetic field non-uniformities on the thrust vector as a function of ion beam current density for a thruster. In some embodiments, the apparatus characterizes the ion beam current of a 5-kW laboratory P5 thruster, operating in uniform and non-uniform magnetic field configurations, while having an azimuthal magnetic field gradient demonstrating a shift in the precise position of the thrust vector in three-dimensional space based on magnetic field non-uniformities.

The sweep probe apparatus generates a three-dimensional plume characterization of the thruster's plasma plume based on the ion beam current generated by the thruster. The probe generates a three-dimensional mapping of the ion beam current. The sweep probe apparatus generates precise and repeatable and accurate characterizations of the plasma plume. In some embodiments, the sweep probe apparatus generates precise and dependable measurements with less than 2 degrees of horizontal and vertical deviations. Because the deviations in the horizontal and vertical directions is less than 2 degrees, a measurement uncertainty in either of the directions is less than 2 degrees as well. As a result, the mechanism that translates the sweep probe apparatus radially in a horizontal direction must operate with minimal tremble and optimum position control.

The probe on the sweep probe apparatus has a collector surface that is arranged in such a way that it is normal, or orthogonal, to the ion beam current. In some embodiments, the probe collection surface remains orthogonal to the plasma plume to maximize the surface area for ion beam current collection. Additionally, it promotes the reduction of sheath potential effects that occur when ions interact with a collector plate of the collector surface.

The sweep probe apparatus can provide continuous sweep measurements throughout extended periods of testing. The sweep probe apparatus can be used for many tests over a long period of time, with the ability to withstand considerable temperature and pressure variations in a vacuum facility environment. The requirement necessitates that the probe instrument possesses robustness and longevity to ensure its sustained utilization in the future.

The impact of the sweep probe apparatus's presence in the plasma plume on the floating potential of the thruster is negligible. The sweep probe apparatus was designed to minimize its impact on the plasma plume and the thruster operating conditions, ensuring accurate plasma performance characteristics.

The sweep probe apparatus has the capability to regulate the frequency of measurement or data sweeps of the plasma plume. The capacity to regulate the frequency of measurements facilitates the acquisition of comprehensive and spatially specific data at the intended locations of interest. The sweep probe apparatus enables the operator to collect more extensive data sets in concentrated areas, such as the centerline for thrust vectoring or plume endpoints for facility effects.

The sweep probe apparatus is lightweight, simplistic in design and experiences minimal back sputtering. The simplistic, lightweight design of the sweep probe apparatus allows for easy installation and utilization of the setup for various testing conditions. It also increases the data collection capabilities of the testing facility, aiding in the advancement of the understanding of the plasma plume.

The sweep probe apparatus has a geared face curved track, motion-controlled gear, probe mount, and probe electronics incorporated into the sweep probe apparatus to move the probe across the plasma plume. In some embodiments, probes other than the Faraday probe can also be attached to the sweep probe apparatus to determine plasma properties at distinct locations within the plume.

The sweep probe apparatus 100 consists of a circular framework with a radius of 1 meter, constructed from lightweight aluminum, as depicted in FIG. 1. The sweep probe apparatus 100 comprises a geared framework 102 on one side, and a curved flat surface insulated from the plasma plume using graphite fragments in the form of a graphite probe mount part 103 on the opposite side. A slot is created in the sweep probe apparatus 100 to accommodate motion bearings 111 and preserve the orthogonality of probe 105 as it moves along the curved trajectory of the sweep probe apparatus 100. In some embodiments, the sweep probe apparatus can be made of aluminum. The bearings 111 are mounted on circular threaded rods that allow the bearings 111 to be placed exactly in a slot formed between a side 112 of the geared framework 102 with teeth and a side 114 of the geared framework 102 without teeth. Rods 116 and 118 are then connected to the aluminum probe mount part 106 by screws (not shown) threaded to the rods 116 and 118.

to guarantee that the probe 105 remains in the correct orientation while sweeping through a plasma plume. In some embodiments, the geared framework 102 covers a range from −41 to 46 degrees, providing a measurement span of 87 degrees of the plasma plume. In other embodiments, the geared framework 102 can be extended to a 180 degrees of span in facilities without spatial restrictions such as floor and a thruster mount.

The graphite probe mount part 103 can be fabricated utilizing a combination of aluminum and graphite components. The aluminum probe mount part 106 is connected to a motion gear 101, and a stepper motor 107. The aluminum probe mount part 106 are brackets. The motion gear 101 and stepper motor 107 are used in combination to control the motion of the probe 105 along the sweep probe apparatus 100. In some embodiments, the stepper motor 107 can be a Nema 17 motor with a 50:1 ratio planetary gearbox. The stepper motor 107 can be used to translate the probe 105 along a 1-m radius path via the motion gear 101. The stepper motor 107 ensures accurate gear movement along the geared framework 102 due to precise motion step control. The stepper motor 107 also provides positional control over the probe 105.

Figure 2:
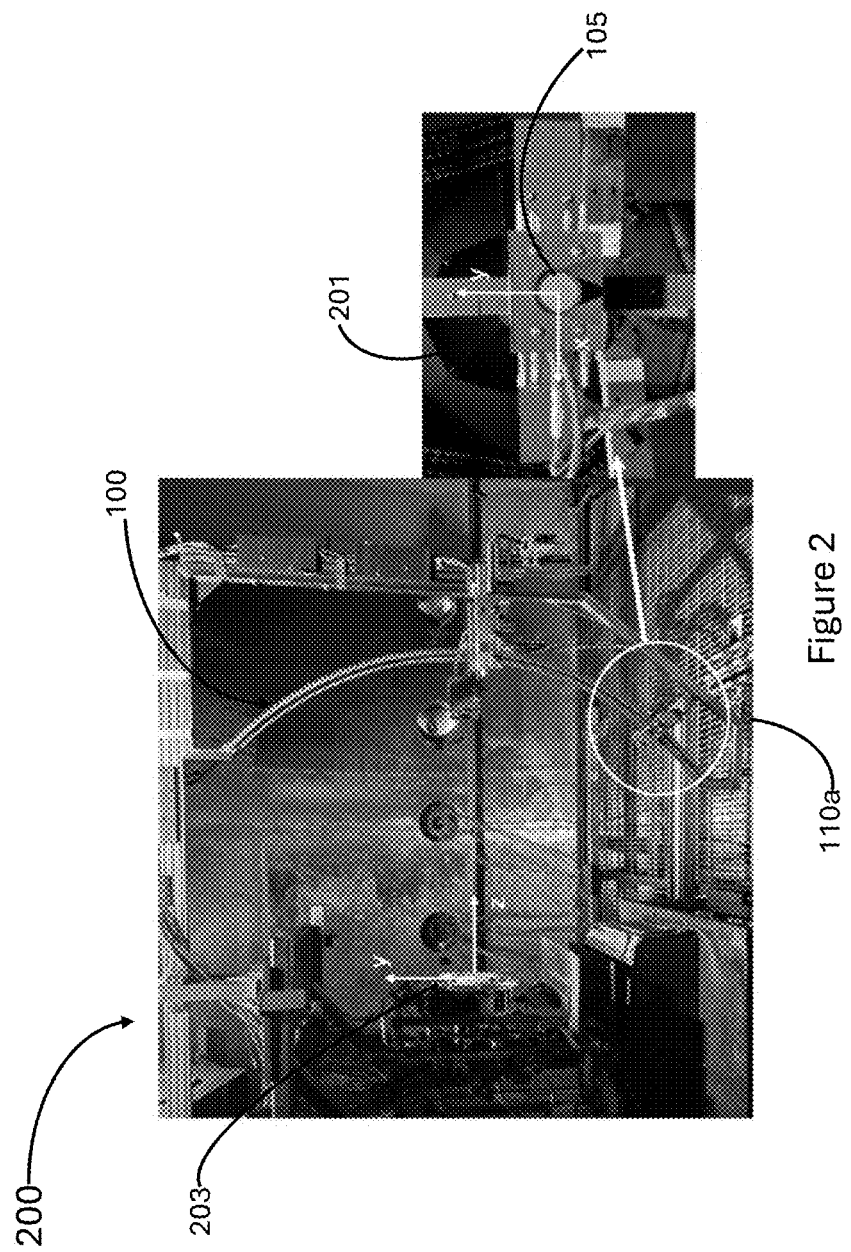
FIG. 2 is a photographic image of a sweep probe apparatus installed in a vacuum test facility according to various aspects of the disclosure.

The graphite component of the graphite probe mount part serves the purpose of connecting the probe 105 to the graphite probe mount 103 while guaranteeing electrical isolation to other components and reduced interference during measurements, as seen in FIG. 2. The probe 105, can be a Faraday probe comprising a stainless-steel casing that is 1 inch in length and a collector coated with tungsten. The probe can comprise flat electrodes specifically designed to measure ion currents. In some embodiments, the flat electrodes can be negatively biased about the local plasma potential. As a result, the probe 105 only ions. In some embodiments, the probe 105 crosses the plasma plume at a set radial distance, resulting in a spatially specified ion beam current density distribution function. The sweep probe apparatus 100 provides a complete three-dimensional mapping of the ion beam current density distribution using the probe 105.

View 110b is a zoomed in view of view 110a of the stepper motor 107, aluminum probe mount part 106, probe 105, graphite probe mount part 103, geared framework 102, bearings 11, and motion gear 101. View 201 is a view of the probe 105 in an orthogonal direction. View 201 is the vantage point from which the probe 105 detects ion beam currents associated with the plasma plume generated by thruster 203. The probe 105 is in a position that is within a conical region formed by the plasma plume. Thereby ensuring that the collector surface of the probe 105 is orthogonal to the plasma plume and therefore the ion beam current.

Ion beam current measurements can be taken in a vacuum facility like the one shown in FIG. 2. In some embodiments, the vacuum facility 200 can be comprised of a 9.2 meter long stainless-steel chamber with a diameter of 4.9 meters. In other embodiments the dimensions of the vacuum facility 200 can be different. A high vacuum can be attained using ten liquid nitrogen-cooled CVI TM1200i cryopumps linked to two Stirling Cryogenics SPC-4 compressors. The pressure can be measured using one Agilent Bayard-Alpert (BA) 571 hot-filament ion gauge on a chamber flange and two MKS Granville Phillips 370. Stabil-ion gauges located 0.3 m downstream of the thruster exit plane and 0.6 meters from the centerline of the thruster. The MKS Granville Phillips 370. Stabil-ion gauges are inside the stainless-steel chamber. The Agilent XGS-600 Gauge Controller is utilized to regulate an outer ion gauge, and the Granville Phillips 370. Controller is used to measure the outer ion gauges inside the stainless-steel chamber to deliver precise pressure measurements. In some embodiments, the ion gauges inside the stainless-steel chamber record nominal operating pressures of 5.9×10−6 Torr-N2 and, 1.1×10−5 Torr-N2, respectively. The operational and base pressures can be measured and then averaged using the MKS Granville Phillips 370. Stabil-ion gauges.

In some embodiments, the operational pressure can be adjusted for krypton using the following equation:

$$P_{operational-corrected} = 1 corr/(P_{operational-measured} - P_{base}) + P_{base}, \quad (1)$$

where corr is equal to 1.96 for krypton. In some embodiments, the resulting base pressure in the vacuum facility can be adjusted to 2.6×10−9 Torr-N2 and the operational pressure in the facility can be adjusted to 3.1×10−6 Torr-Kr using the equation above.

In some embodiments, the thruster can be a 5 kilowatt P5 HET. The thruster has a stainless-steel anode with 36 slot holes, a ceramic discharge channel, an inner magnetic core, and eight outside magnetic cores that generate a magnetic field necessary for the functioning of the thruster. The thruster comprises a boron nitride and silicon dioxide BN—SiO2, M26 grade channel with an outside diameter of 173 mm and channel width of 25 millimeters. The magnetic circuit architecture of eight outer cores form the outer coil circuit and one inner coil. An EPL-500 hollow cathode is positioned such that an orifice of the EPL-500 hollow cathode is 2.2 centimeters downstream of the P5 exit plane and 7 centimeters above the centerline of the thruster at a −35° vertical angular position. In some embodiments, the thruster can be operated at a discharge voltage of 300 V, an anode flow rate of 5.61 mg/s, and a cathode flow rate of 0.44 mg/s of krypton.

Figure 3:
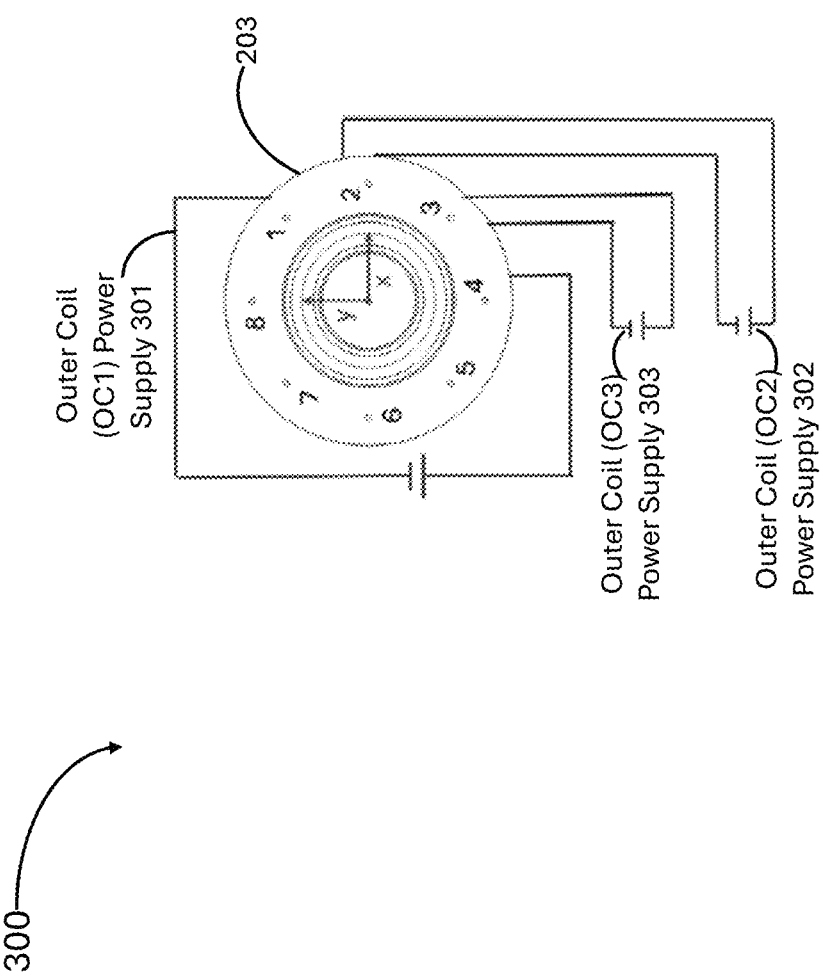
FIG. 3 is a schematic of eight outer cores of a thruster and three power supplies powering the eight outer cores according to various aspects of the disclosure.

In order to evaluate the effect of non-uniformities in the magnetic field of a thruster, on ion beam current and thrust vectors, the outer magnetic circuit is split into three sections. As shown in FIG. 3 outer magnetic circuit 300 includes eight coils, or solenoids, which are powered by a total of three different power supplies. Outer coil (OC1) Power Supply 301 supplies power to coils 4, 5, 6, 7, 8, and 1, Outer Coil (OC2) Power Supply 302 supplies power to coil 2, and Outer Coil (OC3) Power Supply 303 supplies power to coil 3. A controller (not shown) controls the current supplied to the outer magnetic coil circuit 300, thereby enabling an operator a greater degree of control of the coils when creating non-uniformities and uniformities of the plasma plume. The outer magnetic circuit can be divided such that two coils are independently operated, and six coils are connected in series to be operated using a TDK Lambda GEN60-25 power supply (e.g., OC1 Power Supply 301 in FIG. 3). For example, the six coils 4, 5, 6, 7, 8, and 1 are controlled by the amount of power supplied by the OC1 Power Supply 301, coil 2 is controlled by the amount of power supplied by the OC2 Power Supply 302, and coil 3 is controlled by the amount of power supplied by the OC3 Power Supply 303. FIG. 3 shows a schematic representation of the electrical setup for the coils (solenoids). Through the control of current supplied to the outer magnetic coil circuit 300, a magnetic field observed in the channel of the thruster can be locally modified, resulting in the development of an azimuthal magnetic field gradient causing plasma non-uniformities.

As noted above, the sweep probe apparatus has a 1-meter radius and is powered by stepper motor 107 with a step size of 1.8 degrees per step. The stepper motor 107 can be used in conjunction with limit switches positioned at the endpoints to monitor the probe 105's location as it moves along a curved path. The limit switches can be electro-mechanical devices used to send an electrical signal based on a physical interaction. It consists of a plunger which when pushed due to physical contact closes an electrical circuit of the limit switches resulting in current flow and detection that the contact has been made. The limit switches can be placed at −41 degrees and 46 degrees in the vertical direction. Because the limit switches can be placed at −41 degrees and 46 degrees, the number of steps taken by the stepper motor 107 between −41 degrees and 46 degrees can be determined by the Ni motion controller. As a result when the probe 105 moves vertically on geared framework 102, and reaches end points associated with −41 degrees and 46 degrees, the probe 105 comes into contact with the limit switches and the Ni motion controller determines the number of step counts. A radial position of the probe 105 can be based at least in part on the number of step counts. The radial position of the probe 105 is controlled by a motion controller as described below.

The stepper motor 107 can be controlled by a motion controller that adjusts the motor's speed during operation. The motion controller can be a Ni motion controller MID-7604/7602. High-precision limit switches are located at −45 degrees and 50 degrees of the geared framework 102. A probe mount contact activates the limit switch circuit and halts the motion of the probe 105, when the probe mount contact comes into contact with the limit switches. The probe mount contact can be a part of the aluminum probe mount 106.

Figure 5A:
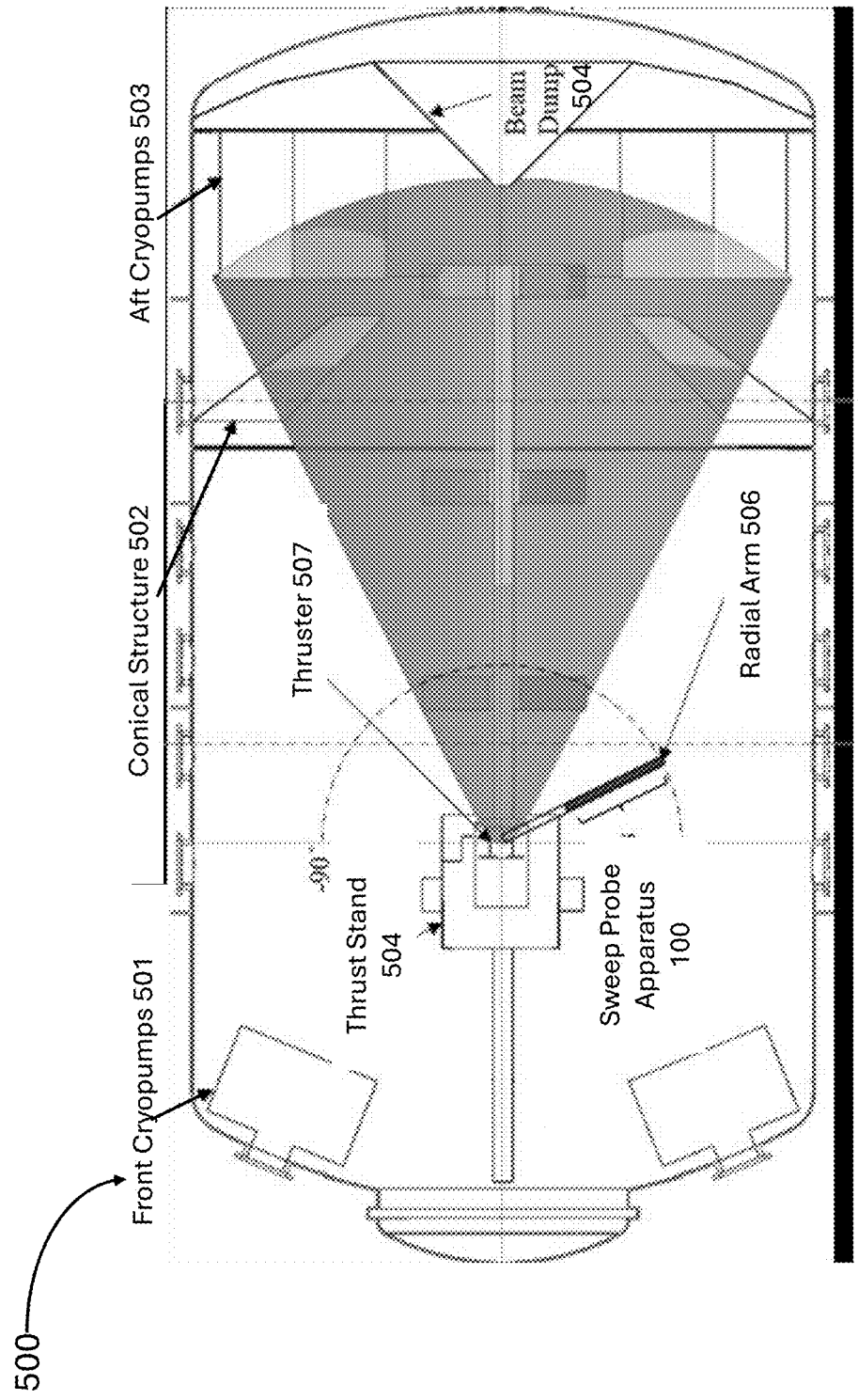
FIG. 5a is a planview of a schematic of the sweep probe apparatus with respect to a thruster in a vacuum test facility according to various aspects of the disclosure.
Figure 5B:
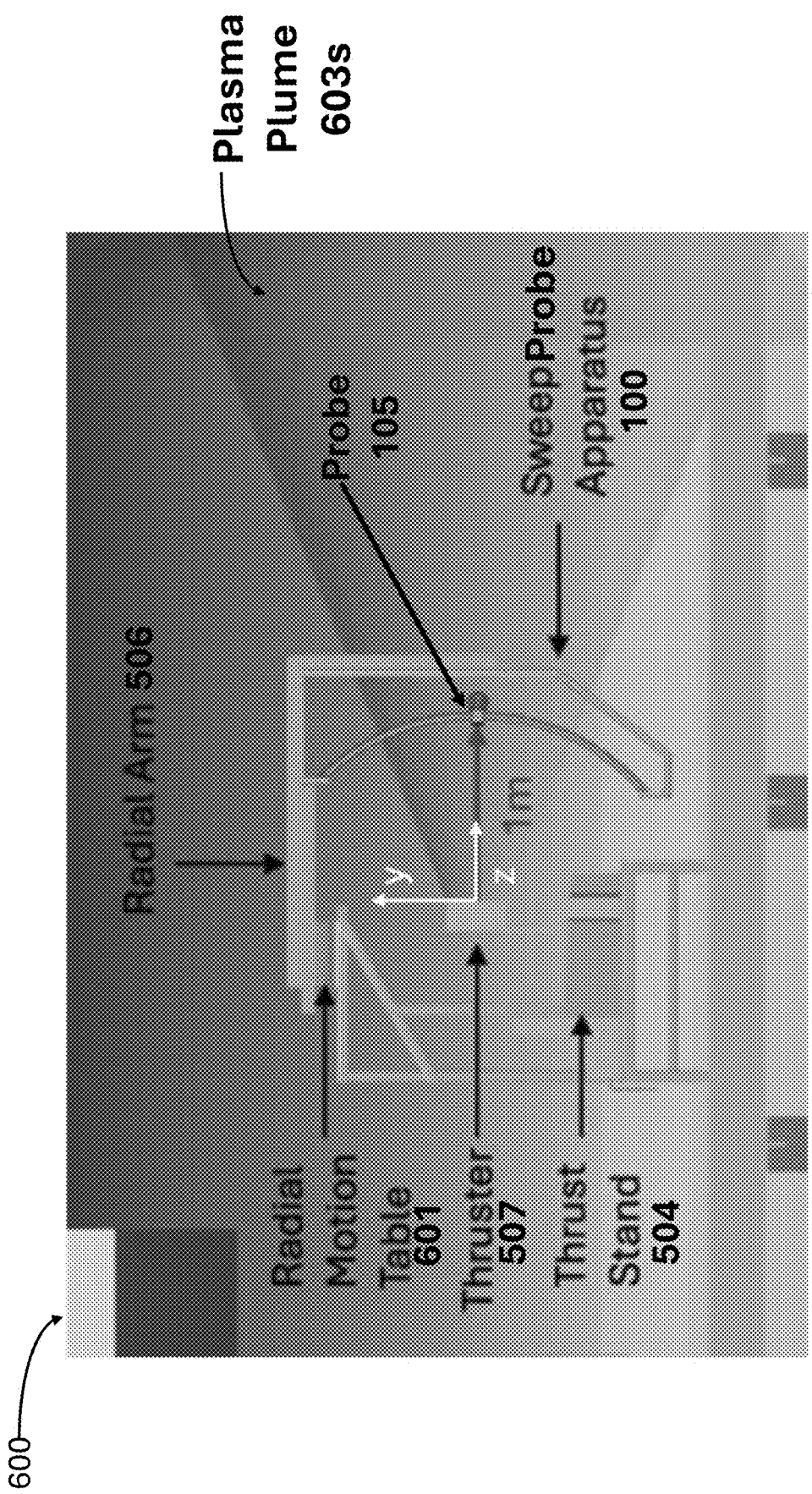
FIG. 5b is a side view of a schematic of the sweep probe apparatus with respect to a thruster in a vacuum test facility according to various aspects of the disclosure.

FIG. 4 illustrates a conventional Faraday probe's horizontal trajectory sweep and vertical sweep conducted using the sweep probe apparatus 100. The entire sweep probe apparatus 100 is positioned on a radial arm (e.g., radial arm 506 as shown in FIGS. 5a and 5b). In some embodiments, the distance between a face of the probe collector and an exit of the thruster is 1 meters.

The radial arm is designed to undergo a horizontal sweeping motion, starting from −90 degrees and ending at 90 degrees with a velocity of 0.63 degrees per second. The radial arm is attached to a rotational motion table. The rotational motion table rotates thereby rotating the radial arm, thereby causing it to sweep out a 180 degree area corresponding to horizontal sweep 401. In some embodiments, the radial arm is controlled by a Parker Daedal 200RT series rotary table, which has the ability to rotate within an accuracy of +17 degrees, as depicted in FIG. 4. While the radial arm is not illustrated in FIG. 4, it moves along a trajectory identical to that of horizontal sweep 401, which can start at −90 degrees on the y-axis (in x-z plane), and sweep through a 180 degree angle until it stops at 90 degrees also on the y-axis (in x-z plane). The radial arm moves a predetermined number of degrees in each step along the horizontal sweep 401, and then stops. At each step along the horizontal sweep 401, the stepper motor 107 moves the probe 105 along a vertical the path of vertical sweep 403 and the probe 105 determines the ion beam current density at each point along the vertical sweep 403 that the probe 105 stops at, for a given step along the horizontal sweep 401.

In some embodiments, the movement of the sweep probe apparatus 100 along the horizontal sweep 401 can be referred to as an angular transverse motion. The radial motion table moves the radial arm, and the radial motion table is controlled by a data acquisition unit (DAQ). The DAQ also controls the movement stepper motor-driven 197 along the vertical sweep 403. In some embodiments the DAQ can be an Agilent 34970A Data Acquisition Unit (DAQ). In some embodiments, the probe's collector surface and guard ring can be biased at −30 V relative to the ground using a source meter. In some embodiments, the source meter can be a Keithley 2470 source meter. The probe location and the ion beam current collected by the collector surface of the probe 105 can be tracked using a virtual instrument such as LabVIEW.

The P5 thruster is powered by a voltage of 300 V, with the outer coil circuits (OC1, OC2, and OC3) and inner coil current set to 4 A and 6 A, respectively. In some embodiments, the thruster can be required to run for three hours before reaching a thermal steady state displayed by a rate of change of thruster temperature of less than 0.5° C./min. After the thruster reaches a thermal steady state, the probe 105 mounted on the radial arm can be utilized to take ion beam current measurements with a horizontal sweep from −90° to 90° for comparison of ion beam current obtained through the measurements taken with the sweep probe apparatus with both a horizontal (−90° to) 90° and vertical sweep (−41° to) 46° configuration. The guard and collector of the probe 105 can be biased at −30 V.

In some embodiments, the probe 105 is moved along the vertical sweep 403 three successive times to remove motion control errors. Following three vertical sweeps, along vertical sweep 403, with the sweep probe apparatus 100, the probe arm 105 is repositioned in a radial direction along horizontal sweep 401, to conduct another vertical scan, along vertical sweep 403, at the next horizontal position. Measurements can be collected at intervals of 5° in the horizontal direction near the centerline of the main plasma plume. In some embodiments, it can takes two hours to perform the mapping of the entire plasma plume region.

The collected data is subsequently analyzed utilizing the correction factors and methodologies expressed in equation (1). Equation (1) can generate analytical results that have an error of around 5% for the beam current and 1.5% for the plume divergence half-angle as compared to measured values for the beam current and the plume divergence half-angle. As a result, the analytical results provided by equation (1) closely mirror the measured results. Characterization of ion beam current for uniform magnetic field configuration provides the baseline condition for comparison to analyze the effect of the magnetic field non-uniformities.

The second test condition involves reducing the current supplied to magnetic circuit OC2 to 0 A. The current reduction results in the introduction of an azimuthal magnetic field gradient of 0.31 G/° in the channel. The ion beam current is characterized using the sweep probe apparatus 100 at this non-uniform magnetic field condition to quantify the relationship between the magnetic field gradient and ion beam current as well as the thrust vector position. An increase in the magnetic field gradient is introduced through the reduction of current supplied to both OC2 and OC3 circuits to 0 Amps. An azimuthal gradient of 0.36 G/° occurs when the current supplied to OC2 and OC3 is 0 Amps. In this scenario, only the six coils connected in series are operational in the outer magnetic circuit, thus making this an extreme operating condition in which to evaluate the changes in thruster plasma characteristics using the disclosed diagnostic apparatus. In some embodiments, at all the test conditions, Langmuir and RPA probes are utilized to provide measurements of electron temperature, plasma potential, and ion energy distribution function used to quantify plasma parameters at the centerline. Measurements of plasma parameters at the centerline allow for understanding variations in far-field plasma plume properties due to non-uniformities in the channel.

FIG. 5a is a schematic 500 of vacuum training facility 200. The schematic 500 comprises front cryopumps 501, aft cryopumps 503, a thrust stand 504 upon which a thruster 507 is supported, the sweep probe apparatus 100, a radial arm 506, and beam dump 504. The beam dump 504 can be a part of the vacuum chamber used to absorb energy of energetic particles. It comprises graphite plates and cryogenic cooling.

A conical structure 502 can be made of graphite plates to guide the flow of plasma inside the chamber along a certain direction.

Schematic 500 is a plan view of the vacuum training facility 200. The sweep probe apparatus 100 is moved in a horizontal direction from −90 degrees to 90 degrees through a plasma plume. The radial arm 506 moves the sweep probe apparatus 100 in the horizontal direction from −90 degrees to 90 degrees though the plasma plume. As the sweep probe apparatus is moved through the plasma plume, the probe (not shown) attached to the sweep probe apparatus 100 collects ions associated with the plasma plume. The probe determines an ion beam current density based on the number of collected ion current.

FIG. 6 is a sideview schematic 600 of vacuum training facility 200. The radial motion table 601 causes radial arm 506 to the probe 105 in a horizontal direction (into the page and out of the page corresponding to the x-axis in FIG. 4). The probe 105 collects ions from the plasma plume 603 generated by thruster 507. The thruster stand 504 supports the thruster 507.

The following paragraphs include measurements of ion beam current densities as a function of the horizontal sweep of the probe 105 and the vertical sweep of the probe 105. The ion beam current density measurements were obtained by providing a uniform current to each of the coils in the outer magnetic circuit 300 of a P5 thruster, in order to produce uniform magnetic field conditions. A Faraday probe measured the ion beam current densities. The ion beam current density measurements acquired by the probe 105 on the sweep probe apparatus 100, are compared with those from a traditional Faraday probe configuration on the radial arm 506. The traditional Faraday probe configuration includes a one stationary Faraday probe positioned in one location along a metal framework, and is swept through a plurality of horizontal positions. Because the Faraday probes in the traditional configuration on the metal framework are stationary, they do not move in the vertical direction, unlike in the instant disclosure in which at least one single probe is moved in both the horizontal and vertical direction.

In some embodiments, the ion beam current densities at the extremities in the vertical direction can be derived from extrapolation of the horizontal observations at −90 degrees and 90 degrees. The ion beam current densities at the extremities in the vertical direction are derived from the extrapolation of the horizontal observations at −90 degrees and 90 degrees when the vacuum chamber is not large enough for the probe 105 to sweep out an entire area of 180 degrees. The thruster vector position is calculated by measuring the peak ion beam current density. A deviation in the thrust vector in the vertical direction, can be detected using the measurements obtained from the sweep probe apparatus 100. Any deviation in the thrust vector was not able to be obtained using the traditional Faraday probe configuration. Unlike the probe 105, the traditional Faraday probe only measures the ion beam current density in two dimensions.

The P5 HET, operating at a voltage of 300 V on krypton with a uniform magnetic field of 145 G, with an anode flow rate of 5.61 milligrams per second (mg/s) and a cathode flow rate of 0.44 mg/s, generated a discharge current of 7.9 A, resulting in an operational power of 2.3 kW. FIG. 6a is a graph of an ion beam current density 701 expressed as a function of a horizontal sweep angle 702. FIG. 6a is a graph of the ion beam current densities, calculated with a traditional Faraday probe configuration, as a function of a 180 degree angle swept out from −90 degrees to 90 degrees in the horizontal direction. The traditional Faraday probe configuration involves attaching a probe to a radial arm and performing a horizontal sweep across the plasma plume, covering an angle range from −90 degrees to 90 degrees in a horizontal direction. After three successive scans for repeatability, the probe detects an ion beam current of 4.11 A and a divergence half angle of 33.2° for the thruster operating at 2.3-kW. The computed ion beam current incorporates any necessary adjustments for secondary electron emissions and charge exchange collisions and is expressed as 95% of the total ion beam current. The ion beam current calculations generated by the traditional Faraday probe configuration relies on numerous assumptions, along with the assumption of an axisymmetric magnetic field. The traditional Faraday probe configuration method of calculating the ion beam current is inapplicable for operating conditions that exhibit unsymmetric plume characteristics and unsymmetrical magnetic field conditions. The ion beam current is calculated using the following equation for the traditional Faraday probe configuration method.

$$I_b = 2\pi R^2 \int_0^{\frac{\pi}{2}} \frac{j[\theta] K_D}{K_A} \sin(\theta) d\theta \quad (1)$$

FIG. 6b is a graph of an ion beam current density 7021 as a function of sweep angle 703. The sweep angle 703 is the angle swept out by the aluminum probe mount part 106 in the vertical direction. FIG. 6b includes a first curve (Raw Vertical Scan with Sweep Probe 707) illustrating the relationship between the ion beam current density measured by the probe 105 as the probe 105 is moved in a vertical direction sweeping out a 87 degree angle between −41 degrees and 46 degrees. The probe 105 is moved down the centerline of the ion beam current, and the ion beam current density is measured at each of the 87 degrees swept out between −41 degrees and 46 degrees. FIG. 6b also includes a second curve (Extrapolated Vertical Scan 705) that is an extrapolation of the ion current beam density of the first curve from −41 degrees to −90 degrees in the vertical direction, and an extrapolation of the ion current beam density of the first curve from 46 degrees to 90 degrees in the vertical direction.

Variations in the plasma plume behavior have a direct impact on the ion current beam density measured at the probe 105. As a result, the changes in the shape of the first curve and the second curve are related to changes in the plasma plume along the x and y axis.

As illustrated in FIG. 7, the ion current beam density of the extrapolated vertical scan with sweep probe 801 curve tracks the ion current beam density of the of the extrapolated horizontal scan with sweep probe 802. The vertical scan with sweep probe 801 curve corresponds to the probe 105 determining an ion beam current density when the probe 105 is moved along the vertical direction along the geared framework 102 from −41 degrees to 46 degrees, and an extrapolation of the ion current beam density of the extrapolated vertical scan with sweep probe 801 curve from −41 degrees to −90 degrees in the vertical direction, and an extrapolation of the ion current beam density of the extrapolated vertical scan with sweep probe 801 curve from 46 degrees to 90 degrees in the vertical direction, while the radial arm 506 is stationary.

The horizontal scan with sweep probe 802 curve corresponds to the probe 105 determining an ion beam current density when the probe 105 is moved, by the radial arm 506, along the radial horizontal direction from −90 degrees to 90 degrees, while the probe 105 is not moving along the geared framework 102.

The horizontal scan with traditional Faraday probe configuration 803 curve corresponds to a Faraday probe attached to a radial arm, which sweeps out a horizontal area from −90 degrees to 90 degrees while the Faraday probe does not move along the vertical axis of the corresponding sweep probe apparatus.

The ion beam current fraction from the vertical scan with sweep probe 801 curve is calculated to be 6.11 A after extrapolation, with a divergence angle of 35.3°. The analysis of the ion beam currents associated with the vertical scan with sweep probe 801 curve and the horizontal scan with sweep probe 802 curve revealed a 6% rise in ion beam current density. The Faraday probes employed in the conventional configuration and on the sweep probe apparatus 100 were identical in design with small differences due to manufacturing tolerances. The plasma plumes associated with the ion beam current densities in FIGS. 6 and 7, were thought to be asymmetrical due to the externally located cathode used to operate the P5 thruster. However, additional measurements with a centrally-mounted cathode could provide further insight about the cause of the variation in the plume measurements. The discrepancies in ion beam current calculations necessitated using a three-dimensional mapping technique to obtain more precise plasma characteristics and plume asymmetry measurements.

The ion beam current densities, in FIGS. 6 and 7, correspond to the radial arm 506 rotating 5 degrees in a horizontal direction, and scanning the plasma plume vertically from −41 degrees to 46 degrees in the vertical direction to obtain three-dimensional ion current measurements. That is the radial arm 506 rotates 5 degrees thereby moving the probe 105 by 5 degrees. After the probe 105 rotates 5 degrees, the radial arm 506 stops, and the probe 105 determines the ion beam current density at each stationary position in the horizontal direction with a standard error of $1.8 \times 10^{-7}$. While conducting vertical scans at various horizontal positions, ion beam current scans at the extremities, namely horizontal angle=−90° 902 and horizontal angle=90° 901, diverge significantly from the ion beam current trends found at the centerline of the plasma plume. The ion beam current at the two extreme locations exhibits a linear variation with the angular sweep, as illustrated in FIG. 8. FIG. 8 is a graph of the ion beam current density 701 as a function of vertical sweep angle 901. The examination of the facility depicted in FIG. 2 allowed for the assessment of the presence of propellant lines at the 90° angle horizontal position, as well as the metallic thrust structure at both locations, as a potential cause for the higher electrical currents observed at the wings compared to the center during a vertical scan. Though the measurements at the extremities are 100 times less in magnitude compared to the center of the thruster, the impact of structural components located close to the thruster on the plume is demonstrated. The sweep probe apparatus 100 is the sole effective tool for observing these.

Figure 9:
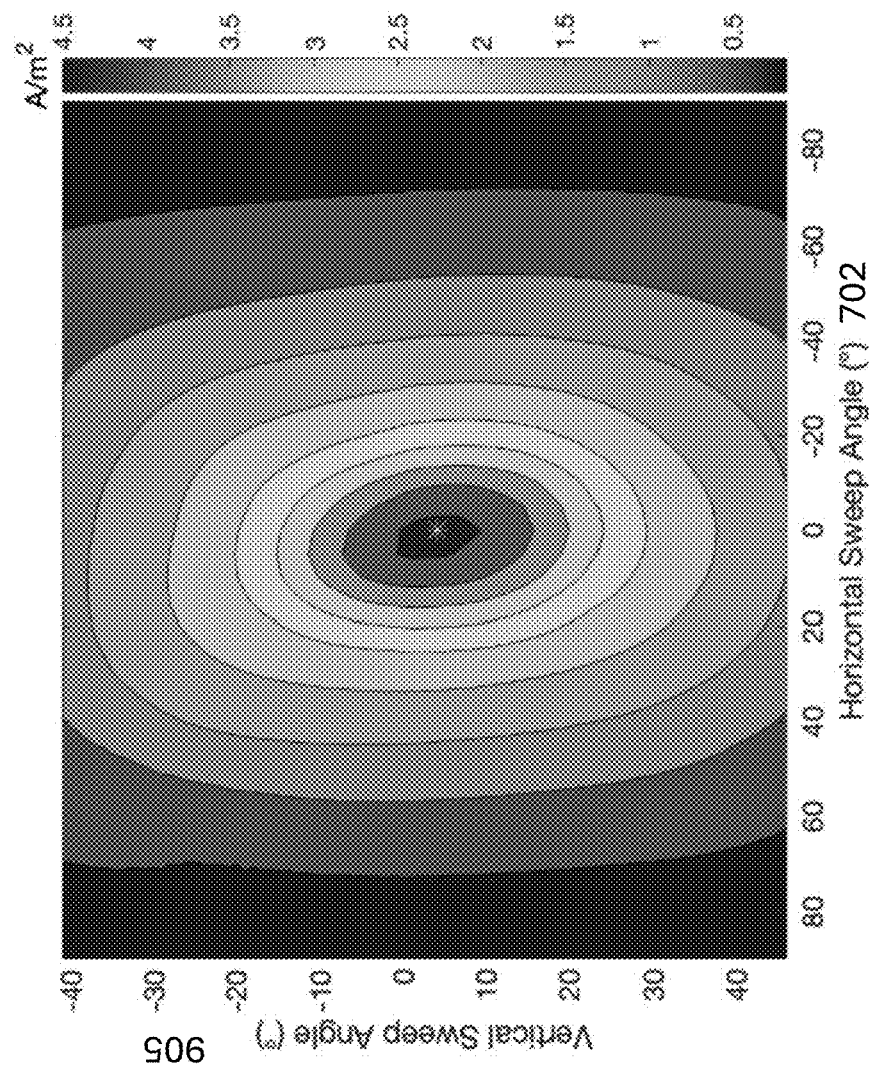
FIG. 9 is a contour map of ion beam current density of a thruster for a given horizontal and vertical sweep angle depicting the position of a plasma plume center for a baseline condition according to various aspects of the disclosure.

FIG. 9 is a full 3-dimensional ion beam current density map. FIG. 9 is a contour map 1000 of ion current density with a horizontal sweep angle between −90 degrees and 90 degrees, and vertical sweep angle from −41 degrees to 46 degrees. FIG. 9 depicts the position of the plasma plume center for a baseline condition. The contour map 1000 includes ion beam current densities of varying degrees of intensity with violet corresponding to some of the smaller ion beam current densities and color dark red corresponding to some of the larger ion beam current densities.

Figure 10:
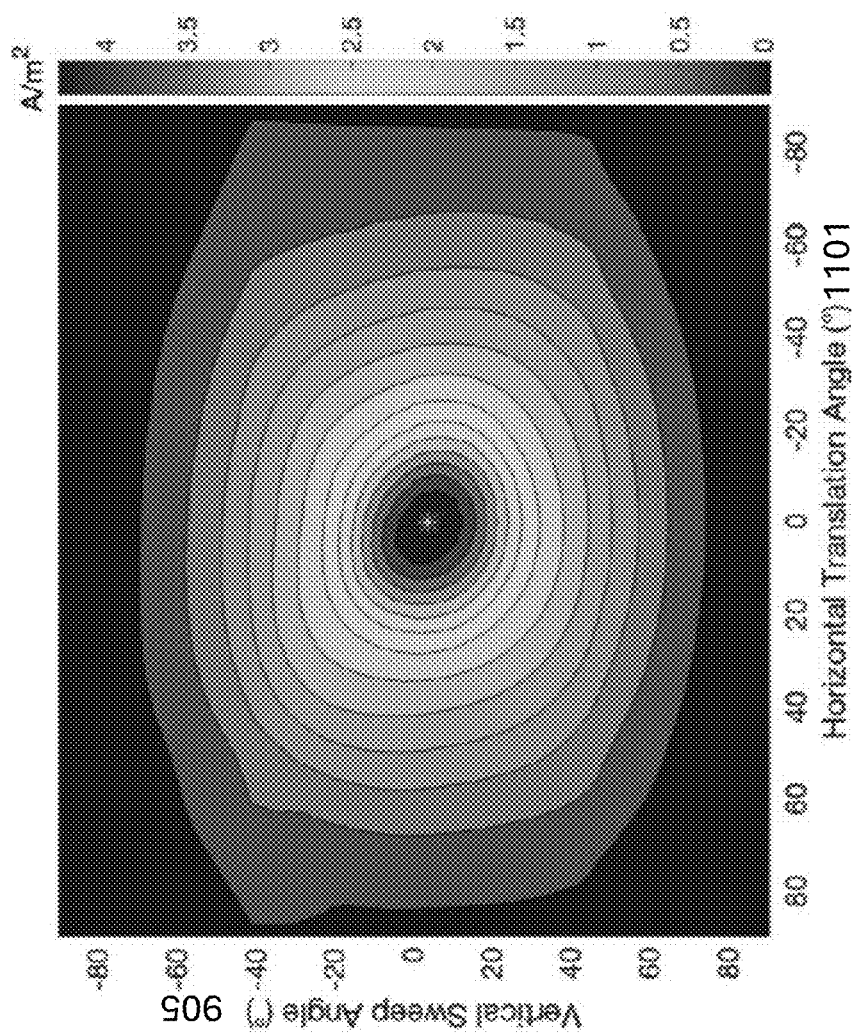
FIG. 10 is a contour map of ion beam current density of a thruster, for a given horizontal and vertical sweep angle, containing extrapolated ion beam current density measurements depicting the position of a plasma plume center for a baseline condition according to various aspects of the disclosure.

The analysis of the raw ion beam current density data from the probe 105 as a result of the three-dimensional horizontal sweep and vertical sweep of the probe 105 through the plasma plume associated with the thruster yielded an estimated ion beam current of 3.60 A, accompanied by a divergence angle of 26.0 degrees. The raw ion beam current density data can be corrected using secondary electron emissions and charge exchanges in the horizontal direction, as the vertical sweep is restricted to −41 degrees to 46 degrees. The vertical scan of the plasma plume yielded a 36.9% decrease in the measurement of ion beam current density due to the restricted vertical sweep range from −41 degrees to 46 degrees. The vertical scans were extrapolated using the horizontal scan measurements to determine the potential full-scale measurement of the ion beam current while preserving the trend of ion beam current density variation across 37 vertical scans. Because the radial arm 506 is rotated 5 degrees after each vertical scan, and the radial arm 506 sweeps out a 180-degree area, a total of 37 vertical scans are taken. The data extrapolation resulted in measurements that span from −90 degrees to 90 degrees in both the vertical and horizontal directions, thereby enabling the total estimation of the hemispherical ion beam current for P5 at 2.3 kW, as illustrated in FIG. 10. The horizontal sweep angle may also be referred to as the horizontal translation angle.

An ion beam current measurement of 5.71 A and a divergence angle of 33.9 degrees is obtained from the extrapolated three-dimensional ion beam current. The ion beam current measurements are evaluated after correcting for secondary electron emissions and charge exchanges at horizontal and vertical angles, yielding a 95% ion beam current percentage. The horizontal sweep mechanism has a negligible effect on the floating potential of the thruster, keeping it constant at −5.84 V and allowing it to be used without impacting its operation. The floating potential of a Hall thruster is the voltage of the thruster body relative to ground potential. The horizontal ion beam current density measurements were subject to uncertainty, and the uncertainty included a ±10% margin of error associated with the probe 105, and a margin of error of less than ±1% associated with the gear motion control system for vertical scan and a ±2% for the horizontal motion control system. The geared motion control system comprises the motion gear 101, the stepper motor 107, and the controllers.

Figure 11:
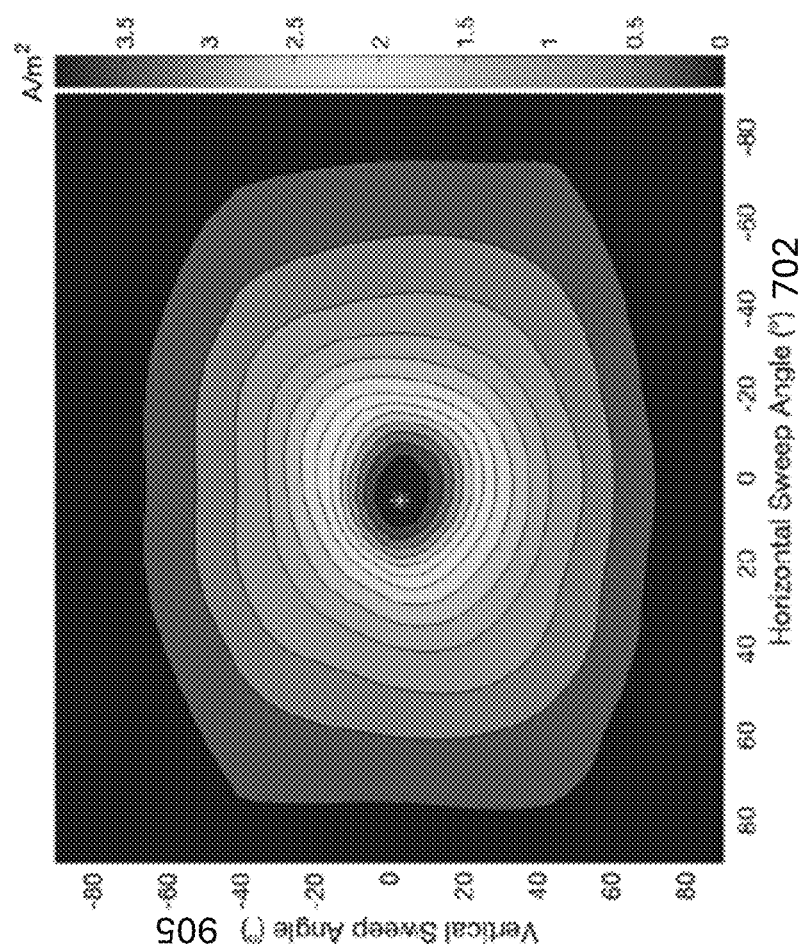
FIG. 11 is a contour map of ion current density of a thruster, for a given horizontal and vertical sweep angle, containing extrapolated ion beam current density measurements depicting the position of a plasma plume center for one coil-off configuration according to various aspects of the disclosure.

The horizontal scan is conducted using the sweep probe apparatus when the magnetic circuit 2 (OC2) power supply 302 powered off, which yielded a 95% ion beam fraction of 4.33 A and a half divergence angle of 34°. The extrapolated vertical scan for the test condition resulted in an ion beam current fraction of 4.74 A, with a divergence angle of 34°. The analysis of the ion beam currents during horizontal and vertical scans revealed a 9.5% rise in ion beam current. Ion current collected through the complete three-dimensional mapping for this operating condition after extrapolation to −90 degrees to 90 degrees is illustrated in FIG. 11.

The analysis of the raw data from the three-dimensional sweep yields an estimated ion beam current of 2.24 A, accompanied by a divergence angle of 26 degrees. The total extrapolated ion beam current for the thruster at 2.3 kW with OC2 power supply 302 circuit turned off resulted in a magnetic field gradient of 0.31 G/, ion beam current measurement of 4.40 A and a divergence angle of 34°. The ion beam current measurements were evaluated after correcting for secondary electron emission and charge exchange at horizontal and vertical angles, yielding a 95% ion beam current percentage.

The horizontal scan conducted using the sweep probe apparatus 100 when magnetic circuits 2 and 3 (OC2 power supply 302 and OC3 power supply 303) were powered off yielded a 95% ion beam current fraction of 4.26 A and a half divergence angle of 34 degrees. The extrapolated vertical scan for the test condition resulted in a 95% ion beam current fraction of 4.59 A, with a divergence angle of 34 degrees. The analysis of the ion beam currents during horizontal and vertical scans revealed a 7.7% rise in ion beam current.

Figure 12:
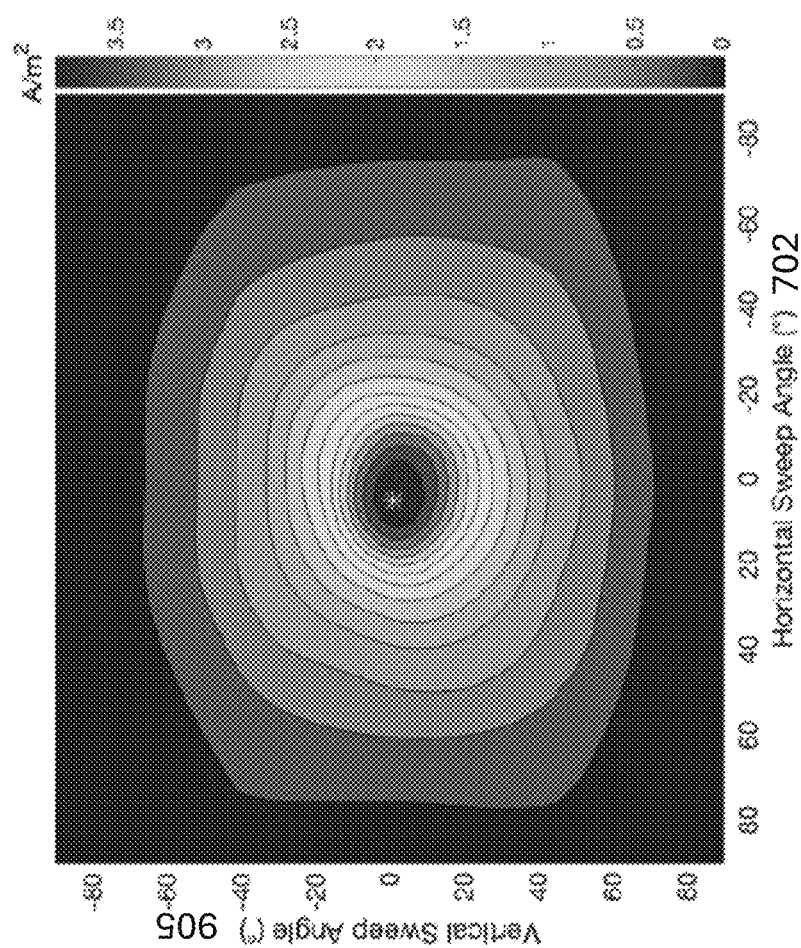
FIG. 12 is a contour map of ion current density of a thruster, for a given horizontal and vertical sweep angle, containing extrapolated measurements depicting the position of a plasma plume center for two coils off configuration according to various aspects of the disclosure.

Ion beam current collected through the complete three-dimensional mapping for this operating condition after extrapolation to −90 degrees to 90 degrees as illustrated in FIG. 12.

The analysis of the raw data from the three-dimensional sweep yielded an estimated ion beam current of 2.19 A, accompanied by a divergence angle of 26 degrees. The total extrapolated ion beam current for P5 at 2.3 kW with OC2 power supply 302 and OC3 power supply 303 off resulted in a magnetic field gradient of 0.36 G/°, ion beam current measurement of 4.33 A and a divergence angle of 34 degrees. The ion beam current measurements are evaluated after correcting for secondary electron emission and charge exchange at horizontal and vertical angles, yielding a 95% ion beam current percentage.

The effects of azimuthal magnetic field gradients on ionization and acceleration processes within the thruster channel, can influence the plasma properties and thus the thrust vector. The experimental results acquired from the sweep probe apparatus 100, which facilitates three-dimensional plume mapping, yield more precise measurements due to enhanced measurement space capabilities. The sweep probe apparatus 100 enhances thruster vectoring measuring capabilities by quantifying peak ion beam current densities that reflect fluctuations in thruster vectoring as an azimuthal magnetic field gradient is applied within the channel.

Measurements of ion beam current at uniform and non-uniform magnetic field conditions demonstrate the impact of the magnetic field on the plasma plume associated with the ion beam current. The ion beam current is estimated using the ion beam current density measurements collected by a sweep of the probe 105, using equation (1). The horizontal and vertical probe sweeps using the sweep probe apparatus 100 provide the measurements for ion beam current and beam divergence for the three test conditions, as seen in Table 1. Table 1 includes data about measured ion beam currents and half divergence angles for horizontal and vertical sweep configurations of the sweep probe apparatus 100, for uniform and non-uniform operating configurations at 300 V, 5.61 mg/s anode, and 0.44 mg/s cathode flow rates.

TABLE 1

| Test Condition | Sweep probe apparatus Configuration | Ion beam Current (A) | Half Divergence Angle (degrees) |
| --- | --- | --- | --- |
| Uniform-baseline | Horizontal Sweep | 5.71 | 35 |
| OC2 circuit off-one coil off | Horizontal Sweep | 4.33 | 34 |
| OC2 and OC3 circuit off-two coils off | Horizontal Sweep | 4.26 | 34 |
| Uniform-baseline | Vertical Sweep with extrapolation | 6.10 | 35 |
| OC2 circuit off-one coil off | Vertical Sweep with extrapolation | 4.74 | 34 |
| OC2 and OC3 circuit off-two coils off | Vertical Sweep with extrapolation | 4.59 | 34 |

In one experiment, the local magnetic field of the thruster 507 was reduced by 9.6%, which resulted in a 24% reduction in the ion beam current when measurements were conducted using the traditional horizontal sweep. In contrast, a 22% reduction in ion beam current and a 2.8% reduction in the divergence of the ion beam occurs during vertical scans when magnetic field changes from a uniform configuration to a non-uniform configuration. A 16.5% decrease in the local magnetic field corresponds to a 25% reduction in the ion beam current when measurements were conducted using the traditional horizontal sweep. In contrast, a 25% reduction in ion beam current and a 2.8% reduction in the divergence of the ion beam current is observed for vertical scans at the extreme operating condition. Extreme operating conditions refer to the operating conditions of the thruster with 1 and 2 coils off. Variations in the ion beam current occur in response to changes in the magnetic field as the sweep direction for measurement is varied. More specifically, as the magnetic field of the thruster 507 changes, so does the ion beam current which is detected by the probe 105, as the probe 105 is moved in the vertical and horizontal directions. Consequently, the plasma plume will not be symmetric due to the changes in the magnetic field in the thruster 507. Hence, it is essential to perform a complete three-dimensional mapping of the ion beam to observe changes with non-uniformities present in the thruster 507.

Table 2 provides measurements obtained from the three-dimensional sweeping of the probe 105, in which the magnetic field in the thruster 507 is decreased by 16.5%, resulting in a 24% decrease in ion beam current and a 2.8% decrease in divergence angle when the magnetic field is varied from uniform a configuration to a non-uniform configuration.

TABLE 2

| Test Condition | $B_l$ (G) | Ion beam Current (A) | Half Divergence Angle (degrees) |
| --- | --- | --- | --- |
| Uniform-baseline | 145 | 5.71 | 35 |
| OC2 circuit off-one coil off | 131 | 4.40 | 34 |
| OC2 and OC3 circuit off-two coils off | 121 | 4.33 | 34 |

To understand the impact of non-uniformities in a magnetic field on ion beam current, it is essential to understand the effect on the ionization and acceleration processes. When there is a localized region of the coils in the thruster 507 that begin to experience a lost of a magnetic field, an azimuthal magnetic field gradient forms in the channel of the thruster 507. Any electrons' confinement in the channel decreases as the electrons transition from a high uniform magnetic field region to a lower magnetic field sectional region as a result of the introduction of the magnetic field gradient in the channel of the thruster 507. Because the confinement of the electrons decreases, the electron flux increases in the region where the magnetic field gradient is formed. A reduction in confinement of the electrons leads to a decrease in collision frequency of the electrons, resulting in a decrease in ionization due to the reduced electron number density. Electrons undergo ohmic heating, leading to a decrease in temperature due to the decreased likelihood of ionization collisions. A decrease in the electron temperature results in a decrease in the energy possessed by the charged species, which leads to a less positive plasma potential at that location. Therefore, an azimuthal magnetic field gradient in the non-uniform operating condition, results in a non-uniform distribution of the electron number density and electron temperature in the channel. The decrease in energy causes the electrons to travel upstream in the region of the azimuthal gradient to gather energy for ionization. This motion leads to a localized shift in the ionization acceleration region, which causes the region to move upstream towards the anode at the gradient's location.

The length of the acceleration region, $L_a$ increases in the magnetic field gradient region due to the variations in the location of the ionization acceleration region. Consequently, the azimuthal gradient influences the ions, as they are formed further upstream within the localized region. The loss voltage increases as a result of the increased likelihood of wall collisions and neutralization collisions among the ions. The acceleration voltage decreases due to the increase in the loss voltage for a fixed discharge voltage. The decrease in acceleration voltage indicates a reduction in ion velocity, which causes a decrease in the ion beam current, $I_b$. The ion beam current is determined by the probe 105, or one or more electronics incorporated in the probe 105, in accordance with equations (2)-(4). It is vital to note that an azimuthal magnetic field gradient influences plasma characteristics in the confined region and causes an overall reduction across the channel. The average integral of the energy distribution of the electron varies from the uniform magnetic field baseline condition as the electron transitions from the low magnetic field gradient region to the high magnetic field uniform region, resulting in reduced energy.

$$I_b = n_i e v_i A \qquad (2)$$

$$v_i = \sqrt{\frac{2eV_a}{m_p}} \qquad (3)$$

$$\frac{V_d}{B_r^2} L_a b_c = \text{constant}, \; L_a \propto \frac{1}{B_r} \qquad (4)$$

$m_i$ ion mass, kg
$L_a$ length of accelerating channel, m
$V_d$ discharge voltage, V
$V_a$ accelerating voltage, V
e electron charge, C
$I_b$ ion beam current, A
$n_i$ ion number density, $m^{-3}$
$v_i$ average ion velocity, $m\ s^{-1}$
A cross-sectional area of the discharge chamber, $m^2$
me mass of electron, kg
j electron current density, $A\ m^{-2}$
BY radial component of the magnetic field, T
θ angular coordinate
B magnitude of the magnetic field, T
$K_D$ correction for probe distance to thruster
$K_A$ correction for ion angle of incidence
$b_c$ channel width, mm
R radial measurement distance, m
$B_l$ maximum local magnetic field in the azimuthal gradient region, G
$\nabla_\theta B_r$ azimuthal magnetic field gradient, G/°

A change in plasma parameters at a far field position, and despite the azimuthal gradient, result in the highest reduction in the magnitude of the magnetic field in the thruster channel 507. The reduction in the magnitude of the magnetic field is 16.5% of the baseline magnetic field in which a azimuthal gradient is not present. In some embodiments, plasma properties can be obtained using Langmuir and RPA probes to provide proof of the proposed explanation for the effect of the magnetic field non-uniformities on the ion beam characteristics. Experimental results demonstrate a reduction of 8.12% in electron temperature and a decrease of 5.09% in acceleration voltage compared to the baseline condition when one coil in the thruster 507 is off. Additionally, there is a decrease of 12.9% in electron temperature and a reduction of 6.03% in acceleration voltage when two coils are off.

The azimuthal magnetic field gradient influences the thruster performance in terms of magnitude and the plume's orientation. A current peak's position is determined and tracked using three-dimensional plasma plume mapping to predict the position of the thrust vector. Qualifying a thrust vector is an intricate process that requires using indirect measuring techniques to quantify the attributes associated with the thrust vector accurately. Plasma properties, including the ion beam current, are estimated to determine the location of the thrust vector. In some embodiments, the current peak of the ion beam current density, which represents the maximum density present and provides the most significant contribution of the ions in the plasma plume, represents the location of the thrust vector. Consequently, the experiments disclosed herein were conducted in the absence of a double current peak. Table 3 displays the thrust vector's location for the baseline line condition and the varying azimuthal magnetic field gradient condition.

| Test Condition | $B_l$ (G) | $\nabla_\theta B_r$ (G/degrees) | Horizontal (degrees) | Vertical (degrees) |
|---|---|---|---|---|
| Uniform-baseline | 145 | 0.00 | 0 | 4 |
| OC2 circuit off-one coil off | 131 | 0.31 | 5 | 3 |
| OC2 and OC3 circuit off-two coils off | 121 | 0.36 | 5 | 1 |

Figure 13B:
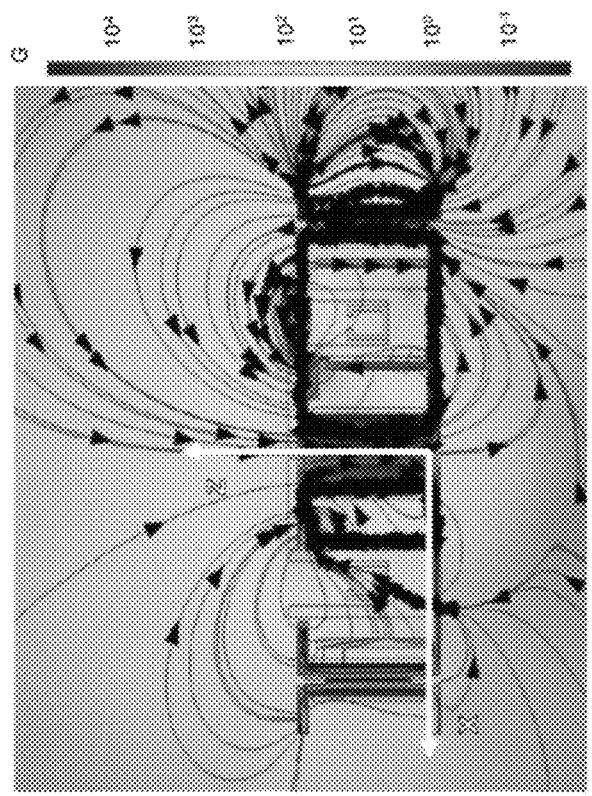
FIG. 13b is a simulation of a magnetic field produced by six powered up coils and two powered off coils in a thruster according to one or more embodiments.
Figure 13A:
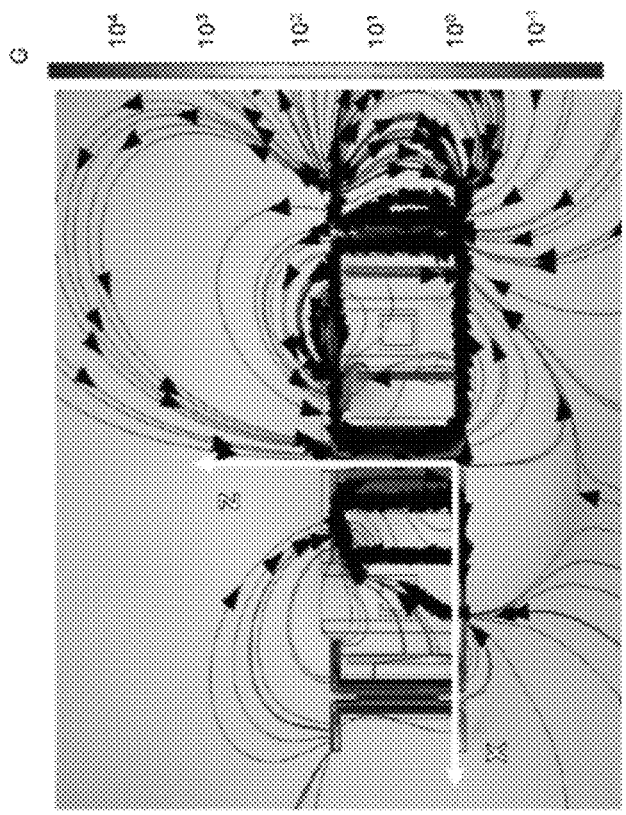
FIG. 13a is a simulation of a magnetic field produced by seven powered up coils and one powered off coil in a thruster comprising eight coils according to one or more embodiments.

Thruster 507's inclination is measured during the installation process, and a vertically downward angular incline of 0.2° is determined. This inclination is 5% of the thrust vector value obtained for the baseline condition and, as a result, is disregarded in the current analysis. The maximum value of the ion beam current occurs at the center line of the thruster in the horizontal sweep direction, which is consistent with the horizontal sweep direction determined by the conventional Faraday probe device. The vertical scan, as well as the vertical and horizontal scan combined (i.e., three-dimensional scan), offers an alternative representation of the position of the thrust vector. The plasma plume center is located 4 degrees below the center of the thruster. Measurements are taken at 0.1 degree intervals thereby making plasma plume characterizations possible and providing excellent tracking capabilities. The probe 105 offers additional validation for its potential application as a measurement tool for tracking the thrust vector of the thruster 507's plasma plume. When two coils of the thruster 507 are, independently actuated, and wherein the two coils are situated on the right side of the thruster 507, as illustrated in FIG. 3, the position of the thrust vector changed to 5° horizontally and 3° vertically when the OC2 Power Supply 302 circuit is off. The incorporation of azimuthal gradient in the magnetic field leads to a reduction in the frequency of ionization collisions. Furthermore, the alteration in length within the ionization acceleration region causes a decrease in the overall ion beam current detected during the scan conducted with the sweep probe apparatus 100 to measure ion beam current density. The ion beam current density peak can deviate due to the magnetic field lines passing through the inner coil being modified due to the OC2 Power Supply 302 being turned off and tilted towards the outer coil rather than at the centerline location, which is probable for the magnetic field lines. As illustrated in FIG. 13, this variation in the magnetic field topology was visible in the COMSOL simulation for the two extreme conditions. The change in the magnetic field line generates a deviation in the equipotential lines. The displacement of equipotential lines influences ion motion, causing the thrust vector to deviate in the direction of the area of the azimuthal gradient. The magnitude of the deviation is contingent upon the span/length of the gradient and the magnitude of the magnetic field. The OC2 and OC3 circuits being off corresponded to the two coils being turned off condition. It is evident that the presence of a 0.04 G/° higher gradient, as opposed to a single coil being off, caused a 2° vertical deviation in the thrust vector. The magnetic field experienced a greater magnitude decrease due to the additional coil's turning off. Additionally, the gradient was able to traverse a larger area, resulting in a fluctuation in the vertical position of the peak.

The sweep probe apparatus 100 offers significant benefits in accurately measuring thruster performance, identifying plume non-uniformities across horizontal and vertical directions, and tracking the thrust vector. The instant disclosure provides an apparatus and methods in which a reasonable estimation of the effects of azimuthal magnetic field gradient on the ion beam current and thrust vector can be determined. Thus, the sweep probe apparatus 100 can be utilized to test thrusters with vectoring capabilities and to examine the effects of clustering thrusters at different positions on the direction of the thruster vector. The sweep probe apparatus's potential utilization for ion current measurement at the points of non-uniformities in the plasma plume highlights the importance of the instrument and allows better quantification of the accuracy of the measurements.

The sweep probe apparatus 100 can be equipped with a Faraday probe which can measure, in three dimensions, the ion beam current across a distribution of the thruster to obtain precise measurements of ion beam currents for thrusters operating with uniform and non-uniform magnetic field configurations. The sweep probe apparatus 100 enables users to quantify non-uniformities in the plasma plume and quantify the location of the thrust vector. The ion beam current measurements obtained using sweep probe apparatus 100, yields results within close proximity to the ion beam current measurements obtained by the traditional Faraday probe configuration in which the Faraday probe is swept across a horizontal region of the plasma plume. The mapping of the plasma plume illustrates the importance of a hemispherical sweep apparatus in obtaining greater precision in measurements of plume parameters without interfering with thruster operation. The thruster vector tracking capabilities of the sweep probe apparatus 100 also enables the quantification of the vertical asymmetry of the thruster's plasma plume, with an inclination of 4 degrees while marinating the horizontal symmetry. The sweep probe apparatus 100 allows for observation of a 0.36 G/degrees azimuthal magnetic field gradient's 24% decrease in ion beam current and 5.8 degree spatial variation of the thrust vector. The potential of the sweep probe apparatus 100 for observing thruster plume non-uniformities and tracking thrust vectors for thrusters, and thruster clusters opens new possibilities for future electric propulsion research.

Figure 14:
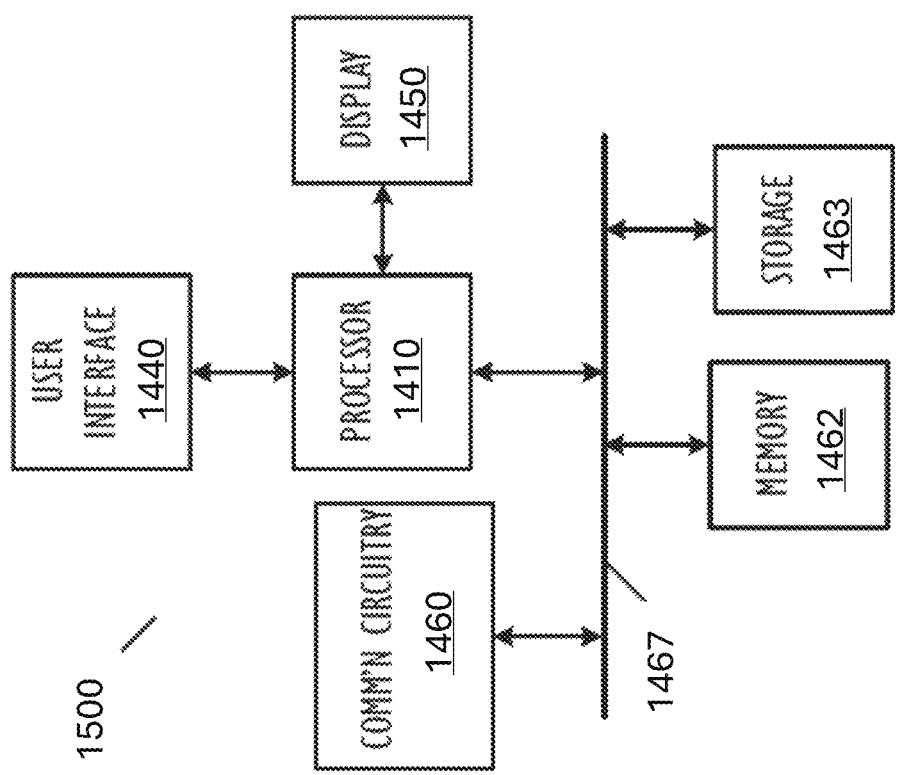
FIG. 14 shows, in block diagram form, a network diagram of a portion of a sweep probe apparatus, according to one or more embodiments.

Referring now to FIG. 14, a simplified functional block diagram of an illustrative multifunctional electronic device 1400 for use in the sweep probe apparatus 100, according to various aspects of the disclosure, is shown. Multifunction electronic device 1400 may include processor 1410, memory 1420, storage device 1430, user interface 1440, display 1450, communications circuitry 1460, and communications bus 1470. Multifunction electronic device 1400 may be, for example, a personal electronic device such as a personal digital assistant (PDA), mobile telephone, or a tablet computer.

Processor 1410 may execute instructions necessary to carry out or control the operation of many functions performed by device 1400. Processor 1410 may, for instance, drive display 1450 and receive user input from user interface 1440. User interface 1440 may allow a user to interact with device 1400. For example, user interface 1440 can take a variety of forms, such as a button, keypad, dial, a click wheel, keyboard, display screen and/or a touch screen. Processor 1410 may also, for example, be a system-on-chip such as those found in mobile devices and include a dedicated graphics processing unit (GPU). Processor 1410 may be based on reduced instruction-set computer (RISC) or complex instruction-set computer (CISC) architectures or any other suitable architecture and may include one or more processing cores.

Memory 1420 may include one or more different types of media used by processor 1410 to perform device functions. For example, memory 1420 may include memory cache, read-only memory (ROM), and/or random access memory (RAM). Storage 1430 may store media (e.g., audio, image and video files), computer program instructions or software, preference information, device profile information, and any other suitable data. Storage 1430 may include one more non-transitory storage mediums including, for example, magnetic disks (fixed, floppy, and removable) and tape, optical media such as CD-ROMs and digital video disks (DVDs), and semiconductor memory devices such as Electrically Programmable Read-Only Memory (EPROM), and Electrically Erasable Programmable Read-Only Memory (EEPROM). Memory 1420 and storage 1430 may be used to tangibly retain computer program instructions or code organized into one or more modules and written in any desired computer programming language. When executed by, for example, processor 1410 such computer program code may implement one or more of the methods described herein.

Referring to FIG. 14, illustrative network architecture 1400, within which a DNS trap system in accordance with various aspects of the disclosure may be implemented, includes a plurality of networks 1405, (i.e., 1405A and 1405B), each of which may take any form including, but not limited to, a local area network (LAN) or a wide area network (WAN) such as the Internet. Further, networks 1405 may use any desired technology (wired, wireless or a combination thereof) and communication protocol (e.g., TCP, or transmission control protocol and PPP, or point to point). Coupled to networks 1405 are data server computer systems 1410 (i.e., 1410A and 1410B) that are capable of executing server applications such as database management applications and, further, are configured to communicate over networks 1405. One embodiment using server computers 1410 may involve the operation of one or more central systems to perform a plurality of simulations, such as Monte Carlo simulations, and distribute the results and any indications of wildcards to nodes on a network. Also coupled to networks 1405, and/or data server computer systems 1410, are client or end-user computer systems 1415 (i.e., 1415A, 1415B and 1415C).

Client or end-user computer systems 1415 may take the form of any computational device including, but not limited to, electronic device 1400 shown in FIG. 14, smartphones, gaming systems, tablet computer systems, desktop or notebook computer systems, set-top box systems, entertainment devices or systems, televisions, virtual-reality or intelligent machines including embedded systems. In some embodiments, network architecture 1400 may also include network printers and network storage systems such as 1425. To facilitate communication between different network devices (e.g., server computer systems 1410, client computer systems 1415, network printers and storage system 1425). Storage system 1425 could, for example, be used to store multi-media items or links to other input, output, or intermediate processing-, storage-, backup-or recovery-related data referenced herein. Data includes application software, configuration, and licensing; application instance and configuration information; analyst configuration and preferences; user, client, and project information, libraries and templates; computational models and ratings; archival storage and backup/recovery information; system resiliency and redundancy information; storage and networking sources and data whether standalone, local, remote, or cloud networked; and metadata and meta-metadata about the aforementioned information.

While certain implementations have been described in terms of what may be considered to be specific aspects, the present disclosure is not limited to the disclosed aspects. Additional modifications and improvements to the aforementioned vial adapter may be apparent to those skilled in the art. Moreover, the many features and advantages of the disclosure are apparent from the detailed specification, and thus, it is intended by the appended claims to cover all such features and advantages of the present disclosure which fall within the spirit and scope of the disclosure.

What is claimed is:

1. A system comprising:
  a first controller comprising:
    at least one first processor configured to execute one or more first computer executable instructions to control a radial arm;
  a second controller comprising:
    at least one second processor configured to execute one or more second computer executable instructions to control a probe apparatus motor;
  a memory storing the:
    one or more first computer executable instructions, and
    one or more second computer executable instructions;
  the radial arm configured to move a probe apparatus in a horizontal direction across a horizontal cross-section of a plasma plume generated by a thruster, in response to receiving a first control signal from the first controller;
  the probe apparatus motor configured to move a probe, coupled to the probe apparatus, in a vertical direction across a vertical cross-section of the plasm plume, in response to receiving a second control signal from the second controller; and
  the probe configured to detect an ion beam current density corresponding to the thruster, and based at least in part on a movement of the probe apparatus in the horizontal direction and a movement of the probe in the vertical direction.

2. The system of claim 1 further comprising:
  a radial motion table communicatively coupled to the radial arm, and
  configured to move the radial arm in radially horizontal direction.

3. The system of claim 2, wherein the first at least one first processor is further configured to execute the one or more first computer executable instructions to:
  transmit the first control signal to the radial motion table with instructions to move the radial arm in the radially horizontal direction by 5 degrees.

4. The system of claim 1, wherein the probe is a Faraday probe.

5. The system of claim 1, wherein the thruster is positioned at a predetermined distance away from the probe.

6. The system of claim 1, wherein the thruster supported by a thruster stand.

7. The system of claim 3, wherein the radial arm sweeps out an area of 180 degrees.

8. The system of claim 3, wherein the probe sweeps out an area of 76 degrees.

9. The system of claim 1, wherein the thruster comprises a plurality of coils, and the plurality of coils are grouped into one or more subsets of coils.

10. The system of claim 9, wherein each of the one or more subsets are supplied power by a different power supply.

11. A probe apparatus comprising:
  a controller comprising at least one processor configured to execute one or more computer executable instructions to control a motion gear;
  a memory storing the one or more computer executable instructions;
  a probe apparatus motor configured to move a probe in a vertical direction across a vertical cross-section of a plasma plume generated by a thruster, and in response to receiving a control signal from the controller;
  a geared framework configured to support the probe, and comprising a first plurality of teeth;
  a motion gear coupled to the probe apparatus motor, and comprising a plurality of second teeth interspersed between the first plurality of teeth; and
  the probe configured to detect an ion beam current density corresponding to the plasma plume based at least in part on:
    a movement of the probe in the vertical direction across the vertical cross-section of the plasma plume, and
    a movement of the probe in a horizontal direction across a horizontal cross-section of the plasma plume.

12. The probe apparatus of claim 11, further comprising at least one bearing in the geared framework communicatively coupled with a first probe mount that is communicatively coupled to a second probe mount supporting the probe.

13. The probe apparatus of claim 12, wherein the first probe mount is comprised of at least aluminum.

14. The probe apparatus of claim 12, wherein the second probe mount is comprised of at least graphite.

15. The probe apparatus of claim 11, wherein the probe is a Faraday probe.

16. The system of claim 11, wherein the thruster is positioned at a predetermined distance away from the probe.

17. The probe apparatus of claim 11, wherein the geared framework comprises a curved flat surface.

18. The probe apparatus of claim 11, wherein the probe sweeps out an area of 76 degrees.

19. The apparatus of claim 11, wherein a surface of the probe is orthogonal to the thruster.

20. A method of determining a three-dimensional ion beam current density, the method comprising:
  moving a probe, using a radial arm motor, to a first horizontal position;
  sweeping the probe, using the probe apparatus motor, through a plurality of vertical positions while the probe is stationary at the first horizontal position;
  determining a first plurality of ion beam current densities, using the probe, corresponding to the probe sweeping through the plurality of vertical positions while stationary at the first the horizontal position;
  sweeping the probe, using the radial arm motor, through a plurality of horizontal positions between the first horizontal position and a second horizontal position;
  sweeping the probe, using the probe apparatus motor, through the plurality of vertical positions while the probe is stationary at each of the plurality of horizontal positions between the first horizontal position and the second horizontal position;
  determining a second plurality of ion beam current densities, using the probe, corresponding to the probe sweeping through the:
    plurality of horizontal positions between the first horizontal position and the second horizontal position, and plurality of vertical positions while the probe is stationary at each of the plurality of horizontal positions between the first horizontal position and the second horizontal position;

moving the probe, using the radial arm motor, to the second horizontal position;

sweeping the probe, using the probe apparatus motor, through the plurality of vertical positions while the probe is stationary at the second horizontal position; and determining a third plurality of ion beam current densities, using the probe, corresponding to the probe sweeping through the plurality of vertical positions while stationary at the second horizontal position; and determining the three-dimensional ion beam current density based at least in part on the first plurality of ion beam current densities, the second plurality of ion beam current densities, and third plurality of ion beam current densities.

21. The method of claim 20, wherein the probe is affixed to a radial arm.

22. The method of claim 21, further comprising:
moving a radial arm, using a radial motion table communicatively coupled to the radial arm, and configured to move the radial arm in radially horizontal direction.

23. The method of claim 20, wherein the probe is a Faraday probe.

24. The method of claim 20, wherein the probe sweeps out an area of 76 degrees in a vertical direction.

25. The method of claim 20, wherein a surface of the probe is orthogonal to a thruster.

26. The method of claim 20, wherein the probe sweeps out an area of 180 degrees in a horizontal direction.

* * * * *